United States Patent
Kajiya et al.

(10) Patent No.: US 8,742,530 B2
(45) Date of Patent: Jun. 3, 2014

(54) CONDUCTION ELEMENT, MANUFACTURING METHOD THEREOF, WIRING ELEMENT, INFORMATION INPUT DEVICE, DISPLAY DEVICE, AND ELECTRONIC APPARATUS

(75) Inventors: Shunichi Kajiya, Miyagi (JP); Kazuya Hayashibe, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/362,397

(22) Filed: Jan. 31, 2012

(65) Prior Publication Data
US 2012/0199384 A1    Aug. 9, 2012

(30) Foreign Application Priority Data
Feb. 7, 2011   (JP) ................. 2011-024466

(51) Int. Cl.
*H01L 31/00* (2006.01)
*H01L 21/00* (2006.01)
(52) U.S. Cl.
USPC ................. 257/459; 257/E31.13; 438/71
(58) Field of Classification Search
USPC ............ 977/742, 773, 932; 174/255; 257/95, 257/458–459, E31.13; 438/29, 71
See application file for complete search history.

(56) References Cited

U.S. PATENT DOCUMENTS

| | | | |
|---|---|---|---|
| 5,356,488 A * | 10/1994 | Hezel | 136/256 |
| 2002/0197460 A1 | 12/2002 | Kaneko et al. | |
| 2003/0111105 A1 * | 6/2003 | Tsukuda et al. | 136/251 |
| 2004/0104121 A1 * | 6/2004 | Kaneko et al. | 205/159 |
| 2006/0043638 A1 | 3/2006 | Corrigan et al. | |
| 2006/0051048 A1 * | 3/2006 | Gardiner et al. | 385/146 |
| 2008/0220559 A1 * | 9/2008 | Fujii et al. | 438/72 |
| 2008/0304155 A1 * | 12/2008 | Endoh et al. | 359/558 |
| 2010/0040887 A1 * | 2/2010 | Han et al. | 428/412 |

FOREIGN PATENT DOCUMENTS

| | | |
|---|---|---|
| EP | 0 548 863 | 6/1993 |
| EP | 1 081 718 | 3/2001 |
| EP | 1 107 320 | 6/2001 |
| EP | 2 068 328 | 6/2009 |
| JP | 2005-149807 | 6/2005 |
| JP | 2009-266025 | 11/2009 |

OTHER PUBLICATIONS

Extended European Search Report dated Apr. 2, 2013 in corresponding European Patent Application No. 12000671.3.

* cited by examiner

*Primary Examiner* — William F Kraig
*Assistant Examiner* — Khaja Ahmad
(74) *Attorney, Agent, or Firm* — K&L Gates LLP

(57) ABSTRACT

A conduction element includes a substrate which has a first wave surface and a second wave surface, and a laminate film which is formed on the first wave surface and where two or more layers are laminated, where the laminate film forms a conduction pattern, and the first wave surface and the second wave surface satisfy a relationship below.

$$0 \leq (Am1/\lambda m1) < (Am2/\lambda m2) \leq 1.8$$

(Here, Am1: average width of vibration in the first wave surface, Am2: average width of vibration in the second wave surface, λm1: average wavelength of the first wave surface, λm2: average wavelength of the second wave surface).

19 Claims, 21 Drawing Sheets

LINE WIDTH: 10 μm

CONDUCTION PORTION: SURFACE RESISTANCE VALUE: 0.5 Ω/□
INSULATION PORTION: ∞

CONDUCTION ELEMENT, MANUFACTURING METHOD THEREOF, WIRING ELEMENT, INFORMATION INPUT DEVICE, DISPLAY DEVICE, AND ELECTRONIC APPARATUS

CROSS REFERENCES TO RELATED APPLICATIONS

The present application claims priority to Japanese Priority Patent Application JP 2011-024466 filed in the Japan Patent Office on Feb. 7, 2011, the entire content of which is hereby incorporated by reference.

BACKGROUND

The present disclosure relates to a conduction element, a manufacturing method thereof, a wiring element, an information input device, a display device, and an electronic apparatus. In detail, the present disclosure relates to a conduction element where a conduction pattern section is formed on a surface of a substrate.

In the past, as a method for forming a conduction layer in a predetermined circuit pattern on an insulating substrate which is formed from glass, plastic, or the like, a circuit pattern forming method where photolithography is used has been widely used. In the circuit pattern forming method, a step and repeat method or a method which is close to this is typically used. Specifically, in the forming method, a circuit pattern is formed through a process of "metal layer coating"→"resist coating"→"exposure"→"development"→"removal"→"resist peeling". As a result, a circuit pattern forming method which uses photolithography has a low throughput.

Therefore, a circuit pattern forming method using screen printing is proposed to realize an improvement in throughput. The circuit pattern forming method using screen printing is a method where a metal paste or the like is coated on an insulating substrate using a squeegee via a mask and a conduction layer of a predetermined circuit pattern is formed by baking after that. Since the throughput of the circuit pattern forming method using screen printing is superior, applications with regard to various devices are being examined. For example, in Japanese Unexamined Patent Application Publication No. 2009-266025, a method is disclosed where an electrode of a touch panel is formed using screen printing. In addition, in Japanese Unexamined Patent Application Publication No. 2005-149807, a method is disclosed where an electrode of an image display device is formed using screen printing.

However, there are problems in that the mask in screen printing is expensive, accurate positioning of the mask is complicated, and it is easy for the holes in the mask to become clogged. As a result, a circuit pattern forming method other than screen printing which is able to achieve superior throughput is desired.

SUMMARY

Accordingly, it is desirable to provide a conduction element, a manufacturing method thereof, a wiring element, an information input device, a display device, and an electronic apparatus where it is possible to realize accuracy and a high throughput.

According to a first embodiment of the present disclosure, a conduction element is provided with a substrate, which has a first wave surface and a second wave surface, and a laminate film, which is formed on the first wave surface and where two or more layers are laminated, and the laminate film forms a conduction pattern and the first wave surface and the second wave surface satisfy a relationship below.

$$0 \le (Am1/\lambda m1) < (Am2/\lambda m2) \le 1.8$$

(Here, $Am1$: average width of vibration in the first wave surface, $Am2$: average width of vibration in the second wave surface, $\lambda m1$: average wavelength of the first wave surface, $\lambda m2$: average wavelength of the second wave surface)

According to a second embodiment of the present disclosure, a manufacturing method of a conduction element includes forming of a laminate film by two or more layers being laminated with regard to a surface of a substrate which has a first wave surface and a second wave surface, and forming a conduction pattern section due to the laminate film which is formed on the first wave surface being left with regard to removing of the laminate film which is formed on the second wave surface out of the first wave surface and the second wave surface, where the first wave surface and the second wave surface satisfy a relationship below.

$$0 \le (Am1/\lambda m1) < (Am2/\lambda m2) \le 1.8$$

(Here, $Am1$: average width of vibration in the first wave surface, $Am2$: average width of vibration in the second wave surface, $\lambda m1$: average wavelength of the first wave surface, $\lambda m2$: average wavelength of the second wave surface)

In the present disclosure, it is preferable that the first wave surface and the second wave surface satisfy a relationship below and the average wavelength of the second wave surface $\lambda m2$ be the wavelength of visible light or less.

$$(Am1/\lambda m1) = 0,\ 0 < (Am2/\lambda m2) \le 1.8$$

In the present disclosure, it is preferable that the first wave surface and the second wave surface satisfy a relationship below, and the average wavelength of the first wave surface $\lambda m1$ and the average wavelength of the second wave surface $\lambda m2$ be the wavelength of visible light or less.

$$0 < (Am1/\lambda m1) < (Am2/\lambda m2) \le 1.8$$

In the present disclosure, it is preferable that the first wave surface and the second wave surface satisfy a relationship below and the average wavelength of the second wave surface $\lambda m2$ be 100 μm or more.

$$(Am1/\lambda m1) = 0,\ 0 < (Am2/\lambda m2) \le 1.8$$

In the present disclosure, it is preferable that the first wave surface and the second wave surface satisfy a relationship below, and the average wavelength of the first wave surface $\lambda m1$ and the average wavelength of the second wave surface $\lambda m2$ be 100 μm or more.

$$0 < (Am1/\lambda m1) < (Am2/\lambda m2) \le 1.8$$

In the present disclosure, it is preferable that a remaining film which is formed on the second wave surface and is a portion of the laminate film be further provided, and the laminate film and the remaining film satisfy a relationship below.

$$S1 > S2$$

(Here, $S1$: area of the laminate film, $S2$: area of the remaining film)

In a case where the relationship is satisfied in this manner, it is preferable that the laminate film which is formed on the first wave surface be formed in a continuous manner on the first wave surface while the remaining film which is formed on the second wave surface be formed in a non-continuous manner on the second wave surface.

In the present disclosure, it is preferable that a remaining film which is formed on the second wave surface and is a portion of the laminate be further provided, and the laminate film and the remaining film satisfy a relationship below.

$$d1 > d2$$

(Here, d1: thickness of the laminate film, d2: thickness of the remaining film)

In the present disclosure, it is preferable that the laminate film be provided with a conduction layer and a functional layer which is formed on the conduction layer and the functional layer be formed from a different material to the conduction layer. It is preferable that the laminate film be formed using materials with different removal speeds from each other. It is preferable that the conduction layer be a transparent conduction layer which includes an oxide compound semiconductor. It is preferable that the oxide compound semiconductor include indium tin oxide or zinc oxide. It is preferable that the conduction layer be in a mixture of amorphous and polycrystalline states. It is preferable that the conduction layer include at least one type selected from a group consisting of Ag, Al, Au, Pt, Pd, Ni, Cr, Nb, W, Mo, Ti, and Cu. It is preferable that the functional layer include at least one type selected from a group consisting of oxide compounds and transition metal compounds. It is preferable that the functional layer include at least one type selected from a group consisting of Ag, Al, Au, Pt, Pd, Ni, Cr, Nb, W, Mo, Ti, and Cu. It is preferable that the functional layer include at least one type of a layer in a mixture of amorphous and polycrystalline states and a layer in a polycrystallized state.

In the present disclosure, it is appropriate if the conduction element is applied to a wiring element, an information input device, a display device, or an electronic apparatus.

As described above, according to the embodiments of the present disclosure, it is possible to realize precision and high throughput.

Additional features and advantages are described herein, and will be apparent from the following Detailed Description and the figures.

DETAILED DESCRIPTION

The embodiments of the present disclosure will be described in the following order while referencing the diagrams.
1. First Embodiment (Example where Conduction Pattern Section is Formed on Substrate Surface using Presence or Absence of Wave Surface)
2. Second Embodiment (Example where Conduction Pattern Section is Formed on Substrate Surface using Difference of Two Types of Wave Surface)
3. Third Embodiment (Example where Conduction Pattern Section is Formed on Both Substrate Surfaces)
4. Fourth Embodiment (Example where Structural Body is Concave Shape)
5. Fifth Embodiment (Application Example with regard to Display Device)
6. Sixth Embodiment (Application Example with regard to Information Input Device)
7. Seventh Embodiment (Application Example with regard to IC Card)
8. Eighth Embodiment (Application Example with regard to Display Device)

1. First Embodiment

Configuration of Conduction Element

Figure 1A:
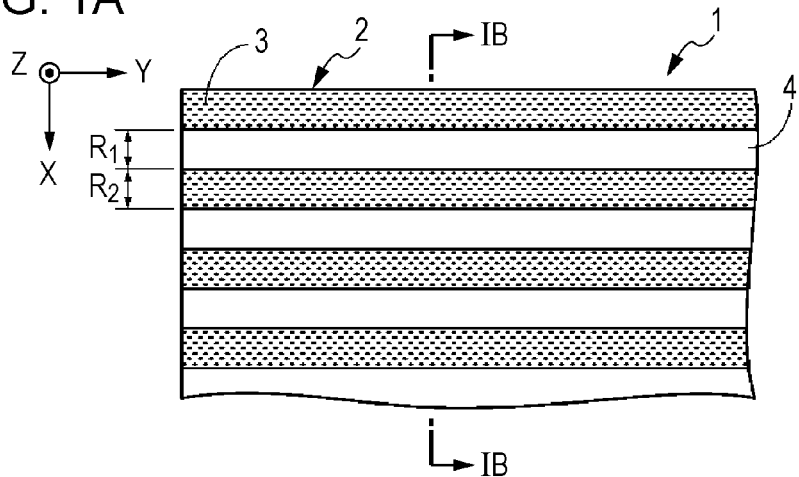
FIG. 1A is a planar diagram illustrating one configuration example of a conduction element according to a first embodiment of the present disclosure.
Figure 1B:
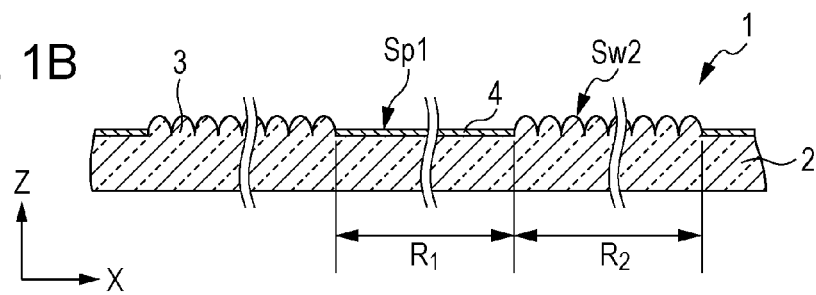
FIG. 1B is a cross-sectional diagram along a line IB-IB shown in FIG. 1A.
Figure 1C:
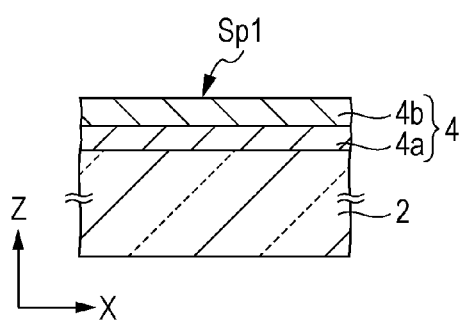
FIG. 1C is a cross-sectional diagram which represents an enlargement of a portion of a first region illustrated in FIG. 1B.
Figure 1D:
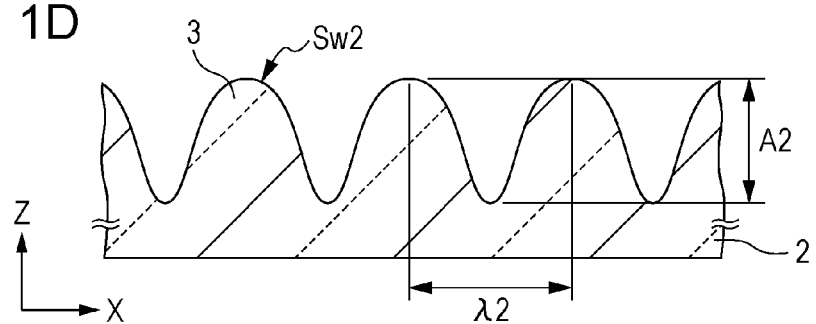
FIG. 1D is a cross-sectional diagram which represents an enlargement of a portion of a second region illustrated in FIG. 1B.

FIG. 1A is a planar diagram illustrating one configuration example of a conduction element according to a first embodiment of the present disclosure. FIG. 1B is a cross-sectional diagram along a line IB-IB shown in FIG. 1A. FIG. 1C is a cross-sectional diagram which represents an enlargement of a portion of a first region illustrated in FIG. 1B. FIG. 1D is a cross-sectional diagram which represents an enlargement of a portion of a second region illustrated in FIG. 1B. Below, two directions which intersect each other in a plane of a main surface of a conduction element 1 are set as the X direction and the Y direction, and a direction which is perpendicular to the main surface is referred to as the Z direction.

The conduction element 1 according to the first embodiment is provided with a substrate 2 which has a first region $R_1$ and a second region $R_2$ which are alternately formed and a laminate film 4 which is formed in the first region $R_1$ out of the first region $R_1$ and the second region $R_2$. The laminate film 4 is formed in a continuous manner on the first region $R_1$ so as to become a conduction pattern section. The conduction pattern section is, for example, a wiring pattern, an electrode pattern, or the like. It is preferable that the laminate film 4 be a laminate film where two or more layers are laminated and include at least a conduction layer 4a.

The conduction element 1 is, for example, a print substrate, an image display element, or the like. As the print substrate, for example, there are rigid substrates, flexible substrates, rigid-flexible substrates, and the like. As the image display element, for example, there are liquid crystal display elements, electroluminescent (EL) elements (for example, organic EL elements and inorganic EL elements), and the like.

(First Region and Second Region)

For example, a flat surface Sp1 is formed on the surface of the substrate in the first region $R_1$ and the laminate film 4 is formed in a continuous manner on the flat surface Sp1. On the other hand, for example, a wave surface Sw2 is formed in the surface of the substrate in the second region $R_2$ and there is a state where the laminate film 4 is not formed on the wave surface Sw2. Accordingly, the second region $R_2$ functions as an insulating region for insulating between the laminate film 4 which is formed on the first regions $R_1$ which are adjacent. With regard to this, the laminate film 4 which is formed on the first region $R_1$ in a continuous manner has conductivity toward the extension direction of the first region $R_1$ and functions as the conduction pattern section.

It is preferable that the flat surface Sp1 and the wave surface Sw2 satisfy the relationship below.

$$(Am1/\lambda m1)=0,\ 0<(Am2/\lambda m2)\leq 1.8$$

(Here, Am1: average width of vibration in the flat surface Sp1, Am2: average width of vibration in the wave surface Sw2, $\lambda$m1: average wavelength of the flat surface Sp1, $\lambda$m2: average wavelength of the wave surface Sw2)

Here, it is possible to define the average width of vibration Am1 and the average wavelength $\lambda$m1 of the flat surface Sp1 and the ratio (Am1/$\lambda$m1) as described above since it is possible to assume that the flat surface Sp1 is a wave surface where the average width of vibration Am1 is "0".

When the ratio (Am2/$\lambda$m2) is more than 1.8, there is a tendency for there to be peeling defects when transferring the wave surface Sw2 and for the wave surface Sw2 to be damaged.

Here, the ratio (Am2/$\lambda$m2) of the wave surface Sw2 is determined as below. First, a cross section of the conduction element 1 is cut off so as to include a position where the width of vibration in the wave surface Sw2 is at its largest and the cross section is imaged using a Transmission Electron Microscope (TEM). Next, the wavelength $\lambda$2 and the width of vibration A2 of the wave surface Sw2 are determined from a TEM photograph which has been imaged. The average wavelength $\lambda$m2 and the average width of vibration Am2 of the wave surface Sw2 are determined by this measurement being performed repeatedly in 10 locations which are selected at random from the conduction element 1 and the measurement values being simply averaged (arithmetical mean). Next, the ratio (Am2/$\lambda$m2) for the wave surface Sw2 is determined using the average wavelength $\lambda$m2 and the average width of vibration Am2.

The wave surface Sw2 is, for example, a one-dimensional or a two-dimensional wave surface which has a wavelength which is the wavelength of visible light or less, and specifically, is a concave and convex surface where a plurality of structural bodies 3 are arranged one-dimensionally or two-dimensionally at an arrangement pitch which is the wavelength of visible light or less.

The cross-sectional shape when the wave surface Sw2 is cut toward one direction so as to include a position where the width of vibration in the wave surface Sw2 is at its largest is a waveform where a triangular waveform, a sine waveform, a quadratic curve, or a portion of a quadratic curve is repeated, a form which resembles these, or the like. As a quadratic curve, there are circles, ellipses, parabolas, and the like.

The average wavelength $\lambda m2$ of the wave surface Sw2 is preferably in a range of 100 nm or more. When the average wavelength $\lambda m2$ is less than 100 nm, there is a tendency for the manufacturing of the wave surface Sw2 to be difficult.

In addition, the average wavelength $\lambda m2$ of the wave surface Sw2 is preferably in the range of 100 μm or less. When average wavelength $\lambda m2$ exceeds 100 μm, there are problems with steps and coverage during imprinting and film formation and defects occurring.

It is preferable that the laminate film 4 or a portion thereof be not present at all as remaining film in the second region $R_2$, but may be present as remaining film if it is to the extent that the second region $R_2$ functions as an insulating region. In a case where there is remaining film in the second region $R_2$, it is preferable that the laminate film 4 which is formed in the first region $R_1$ and the remaining film which is formed in the second region $R_2$ satisfy the relationship below.

$$S1 > S2$$

(Here, S1: area of the laminate film, S2: area of the remaining film)

In a case where the relationship is satisfied in this manner, it is preferable that the laminate film 4 be formed in a continuous manner in the first region $R_1$ while the remaining film be formed in a non-continuous manner such as an island shape in the second region $R_2$.

In addition, in a case where the remaining film is present in the second region $R_2$, it is preferable that the laminate film 4 which is formed in the first region $R_1$ and the remaining film which is formed in the second region $R_2$ satisfy the relationship below.

$$d1 > d2$$

(Here, d1: thickness of the laminate film, d2: thickness of the remaining film)

In a case where the relationship is satisfied in this manner, it is preferable that the thickness of the remaining film is thinner than the thickness of the laminate film 4 to the extent that conductivity is not exhibited in practice and the second region $R_2$ functions as an insulating region.

Here, as described above, since the remaining film does not function as the conduction pattern section, the diagrammatical representation of the remaining film is omitted in FIGS. 1B and 1D. In addition, in FIG. 1A, an example is shown where the laminate film 4 which is formed in a continuous manner in the first region $R_1$, that is, the conduction pattern section, has a shape with a linear form, but the shape of the conduction pattern section is not limited to this and it is possible for a desired shape to be set according to the design of the circuit, the element, or the like.

Below, the substrate 2, the structural body 3, and the laminate film 4 which configure the conduction element 1 will be described in turn.

(Substrate)

The substrate 2 is, for example, a substrate which has transparency or no transparency. As the material of the substrate 2, it is possible to use an organic material such as a plastic material or an inorganic material such as glass.

As the glass, for example, soda-lime glass, lead glass, hard glass, quartz glass, liquid crystal glass, and the like ("Handbook of Chemistry" basic edition, P.I-537, reference The Chemical Society of Japan edition) are used. As a plastic material, from a point of view of optical properties such as transparency, refractive index, and dispersion, and further various properties such as shock resistance, heat resistance, and durability, (meth)acrylic resins such as polymethyl methacrylate, methyl methacrylate, and other alkyl(meth)acrylates, copolymer with vinyl monomers such as styrene, polycarbonate resins such as polycarbonate, diethylene glycol bis allyl carbonate (CR-39), heat curable (meth)acrylic resins such as a single polymer or a copolymer of di(meth)acrylate of (bromination) bisphenol A type, a polymer or a copolymer of urethane-modified monomer of (bromination) bisphenol A mono(meth)acrylate, polyester, in particular, polyethylene terephthalate, polyethylene naphthalate, and unsaturated polyester, acrylonitrile-styrene copolymer, polyvinyl chloride, polyurethane, epoxy resin, polyarylate, polyether sulfone, polyether ketone, cyclo-olefin polymer (product name: arton and zeonor) and the like are preferable. In addition, it is also possible to use an aramid-based resin from the point of view of heat resistance.

In a case where a plastic material is used as the substrate 2, an undercoating layer may be provided as surface treatment in order to further improve surface energy, coating properties, sliding properties, flat surface properties, and the like of the plastic surface. As the undercoating layer, for example, there is organoalkoxy metal compounds, polyester, acrylic-modified polyester, polyurethane, and the like. In addition, corona discharge or UV irradiation treatment may be performed with regard to the surface of the substrate 2 in order to obtain the same effects as the undercoating layer being provided.

In a case where the substrate 2 is a plastic film, it is possible for the substrate 2 to be obtained using a method where, for example, a resin described above is stretched, or after being diluted by a solvent, is deposited in a film shape and dried, or the like. In addition, the thickness of the substrate 2 is, for example, approximately 25 μm to 500 μm.

As the shape of the substrate 2, for example, there is a film shape, a plate shape, or a block shape, but is not particularly limited to these shapes. Here, a sheet is defined to be included as a film.

(Structural Body)

The wave surface Sw2 is, for example, a concave and convex surface where a plurality of structural bodies 3 are arranged in the second region $R_2$. The structural body 3 has, for example, a convex shape with regard to the surface of the substrate 1. For example, the structural body 3 is formed separately to the substrate 2 or is formed integrally with the substrate 2. In a case where the structural bodies 3 and the substrate 2 are formed separately, a base layer may be provided between the structural bodies 3 and the substrate 2 as necessary. The base layer is a layer which is integrally formed with the structural bodies 3 at a bottom surface side of the structural bodies 3 and is formed by curing a resin compound with the same energy line curing properties as the structural bodies 3 or the like. The thickness of the base layer is not particularly limited and is able to be appropriately selected as necessary.

It is preferable that the aspect ratio (Hm/Pm) of the structural bodies 3 satisfies the relationship below.

$$0 < (Hm/Pm) \leq 1.8$$

(Here, Hm: average height of the structural bodies 3, Pm: average arrangement pitch of the structural bodies 3)

When the ratio (Hm/Pm) is greater than 1.8, there is a tendency for there to be peeling defects when transferring the structural bodies 3 and for the structural bodies 3 to be damaged.

Here, the aspect ratio (Hm/Pm) of the structural bodies 3 is determined as below. First, a cross section of the conduction element 1 is cut off so as to include a position where the height of the structural bodies 3 is at its highest and the cross section is imaged using a Transmission Electron Microscope (TEM). Next, the arrangement pitch P and the height H of the structural bodies 3 are determined from a TEM photograph which has been imaged. The average arrangement pitch Pm and the average height Hm of the structural bodies 3 are determined by this measurement being performed repeatedly in 10 locations which are selected at random from the conduction element 1 and the measurement values being simply averaged (arithmetical mean). Next, the aspect ratio (Hm/Pm) for the structural bodies 3 is determined using the average arrangement pitch Pm and the average height Hm.

As the arrangement of the plurality of structural bodies 3, for example, it is possible to use a one-dimensional or a two-dimensional arrangement. As the arrangement of the structural bodies 3, for example, it is possible to use a regular arrangement or an irregular arrangement, and it is preferable that an appropriate arrangement be selected out of the arrangements described above according to the manufacturing method of the base.

It is preferable that the average arrangement pitch Pm of the structural bodies 3 be a wavelength band of light which has the aim of reducing reflection or less from the point of view of reducing the reflecting of light in the conduction element surface. The wavelength band of light which has the aim of reducing reflection is, for example, a wavelength band of ultraviolet light, a wavelength band of visible light, or a wavelength band of infrared light. Here, the wavelength band of ultraviolet light is a wavelength band which is equal to or more than 10 nm and equal to or less than 360 nm, the wavelength band of visible light is a wavelength band which is equal to or more than 360 nm and equal to or less than 830 nm, and the wavelength band of infrared light is a wavelength band which is equal to or more than 830 nm and equal to or less than 1 mm. Specifically, the average arrangement pitch Pm is preferably equal to or more than 180 nm and equal to or less than 350 nm, more preferably equal to or more than 100 nm and equal to or less than 320 nm, and even more preferably equal to or more than 110 nm and equal to or less than 280 nm. When the average arrangement pitch Pm is less than 180 nm, there is a tendency that manufacturing of the structural bodies 3 is difficult. On the other hand, when the average arrangement pitch Pm exceeds 350 nm, there is a tendency for diffraction of visible light to occur.

Below, the second region $R_2$ where the plurality of structural bodies 3 are arranged in a one-dimensional manner or a two dimensional manner will be described in a specific manner while referencing FIGS. 2A to 3B.

Figure 2A:
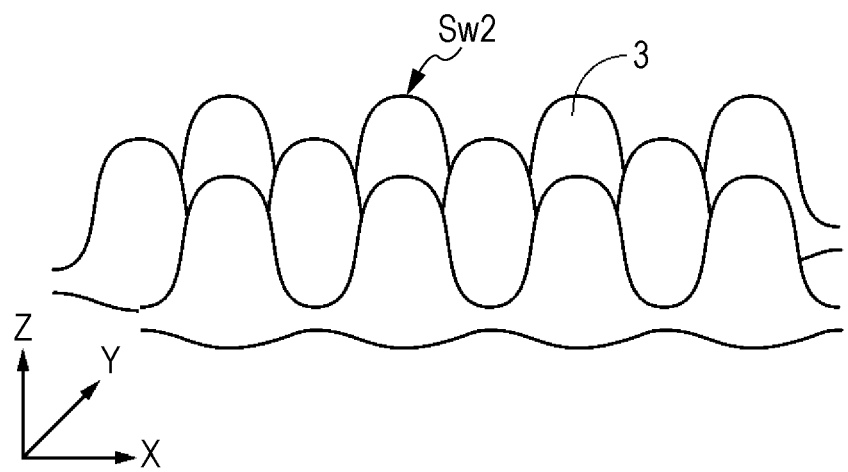
FIG. 2A is a perspective diagram representing an enlargement of the second region where a plurality of structural bodies is arranged in a two-dimensional manner.
Figure 2B:
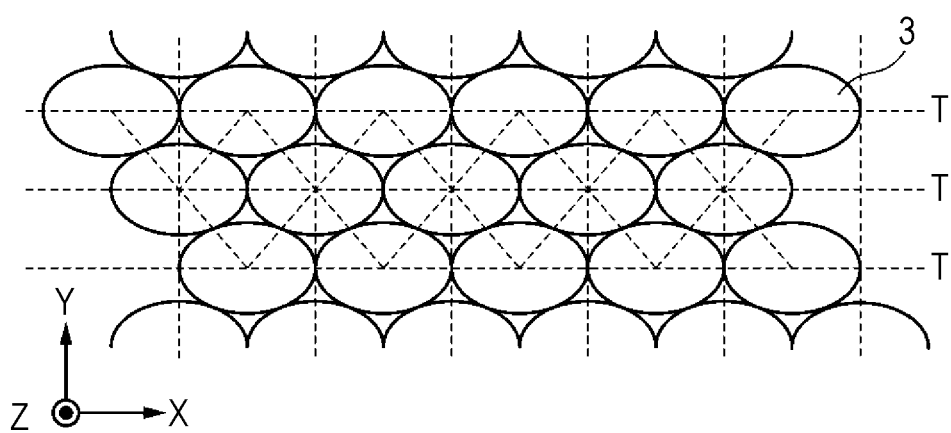
FIG. 2B is a planar diagram representing an enlargement of the second region where a plurality of structural bodies is arranged in a two-dimensional manner.

FIG. 2A is a perspective diagram representing an enlargement of the second region where the plurality of structural bodies is arranged in a two-dimensional manner. FIG. 2B is a planar diagram representing an enlargement of the second region where the plurality of structural bodies is arranged in a two-dimensional manner. The plurality of structural bodies 3 are arranged in, for example, a two-dimensional manner on a plurality of rows of tracks T in the second region $R_2$. As the shape of the track T, it is possible to use a linear form, an arc form, or the like, and the tracks T with these shapes may be made to wobble. The plurality of structural bodies 3 which are arranged on the plurality of rows of tracks T may be, for example, an arrangement pattern which is regular in a predetermined manner. As the arrangement pattern of the structural bodies 3, there is a grid shape pattern such as a four-directional grid shape, a six-directional grid shape, or the like and the grid shape pattern may be warped. The height of the structural bodies 3 may be made so as to change in a regular or irregular manner in the surface of the substrate 2. In addition, the structural bodies 3 may be arranged in a random manner.

As a specific shape of the structural bodies 3, for example, there is a cone shape, a column shape, a needle shape, a semispherical shape, an elliptical semispherical shape, a polygonal shape, or the like, but is not limited to these shapes and another shape may be adopted. As the cone shape, for example, there is a cone shape where the tip portion is sharpened, a cone shape where the tip portion is flat, a cone shape which has a curved surface which is a convex shape or a concave shape in the tip portion, and the like, but is not limited to these shapes. In addition, the conical surface of the cone shape may be curved into a concave shape or a convex shape. In a case where a roll base is manufactured using a roll base exposure device (refer to FIG. 6) which will be described later, it is preferable that an elliptical cone shape which has a curved surface which is a convex shape in the tip portion or an elliptical trapezoidal cone shape where the tip portion is a flat shape be adopted as the shape of the structural bodies 3 and the direction of the longitudinal axis of the elliptical shape which is formed in the bottom surface thereof matches the extension direction of the track T.

Figure 3A:
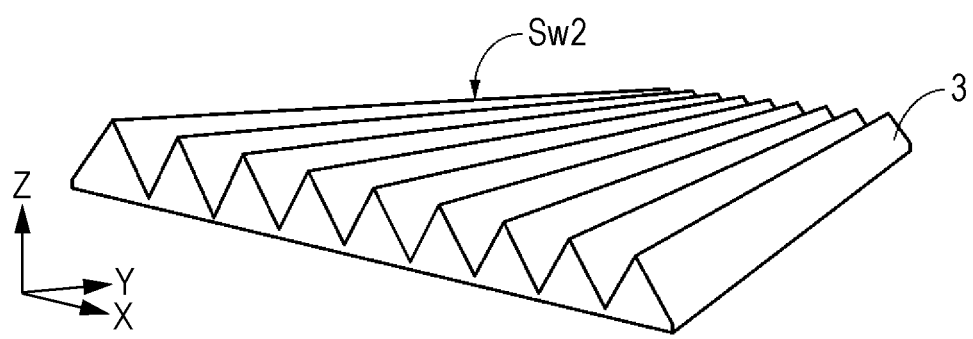
FIG. 3A is a perspective diagram representing an enlargement of the second region where a plurality of structural bodies is arranged in a one-dimensional manner.
Figure 3B:
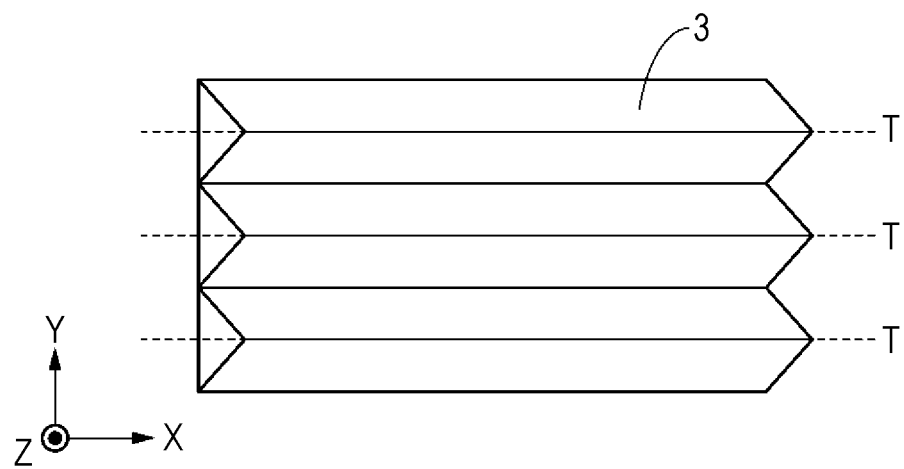
FIG. 3B is a planar diagram representing an enlargement of the second region where a plurality of structural bodies is arranged in a one-dimensional manner.

FIG. 3A is a perspective diagram representing an enlargement of the first region where a plurality of structural bodies is arranged in a one-dimensional manner. FIG. 3B is a planar diagram representing an enlargement of the first region where a plurality of structural bodies is arranged in a one-dimensional manner. The plurality of structural bodies 3 are arranged in, for example, a one-dimensional manner on the plurality of rows of tracks T in the second region $R_2$ along the tracks T. As the shape of the track T, it is possible to use a linear form, an arc form, or the like, and the tracks with these shapes may be made to wobble.

For example, the structural bodies 3 are column shaped bodies which extend toward one direction, and it is possible that the cross-sectional shape thereof is, for example, a triangular shape, a triangular shape where a curve R is attached to the tip portion, a polygonal shape, a semispherical shape, an elliptical semispherical shape, a parabolic shape, or the like, but is not limited to these shapes. As the specific shape of the structural bodies 3, it is possible that there is, for example, a lenticular shape, a prism shape, or the like, but is not limited to these shapes. The height of the structural bodies 3 may be made to change toward the track direction. In addition, the structural bodies 3 may be discontinuous in the track direction.

(Laminate Film)

The laminate film 4 is provided with, for example, the conduction layer 4a which is formed on the first region $R_1$ and a functional layer 4b which is formed on the conduction layer 4a. It is preferable that the laminate film 4 is configured from a material with a different removal speed, specifically, a laminate film with a different removal speed. As the conduction layer 4a, for example, it is possible to use a metal layer, a transparent conduction layer, a metal oxide compound layer, a transition metal compound layer, or the like, but is not limited to this. As the material of the functional layer 4b, it is preferably at least a different material to the conduction layer 4a, and furthermore, it is preferable that there is a dissolution rate difference during a removal process.

As the transparent conduction layer, for example, it is possible to use an inorganic transparent conduction layer. It is preferable that the inorganic transparent conduction layer has a transparent oxide compound semiconductor as a main component. As the transparent oxide compound semiconductor, for example, it is possible to use a two element compound such as $SnO_2$, $InO_2$, ZnO, or CdO, a three-dimensional compound which includes at least one element out of Sn, In, Zn, and Cd which is a constituent element of a two element compound, or a multi-element (composite) oxide compound. As specific examples of the transparent oxide compound semiconductor, for example, there are indium tin oxide (ITO), zinc oxide (ZnO), aluminum-doped zinc oxide (AZO ($Al_2O_3$, ZnO)), SZO, fluorine-doped tin oxide (FTO), tin oxide ($SnO_2$), gallium-doped zinc oxide (GZO), indium zinc oxide (IZO ($In_2O_3$, ZnO)), and the like. In particular, indium tin oxide (ITO) is preferable from the point of view of higher reliability, lower resistance rate, and the like. It is preferable that the material which configures a transparent oxide compound film be a mixture of amorphous and polycrystalline states from the point of view of improving conductivity.

As the material of the metal layer, for example, it is possible to use at least one type chosen from a group consisting of Ag, Al, Au, Pt, Pd, Ni, Cr, Nb, W, Mo, Ti and Cu.

As the functional layer 4b, it is desirable that the dissolution or etching rate with regard to an etchant be different with regard to at least the conduction layer 4a, and it is desirable to have a state where the etchant durability is improved by, for example, the function layer 4b being multi-crystallized using a metal oxide compound layer such as $SiO_2$, a transition metal compound, or films which has different crystalline states. It is preferable that the functional layer 4b include at least one type from a layer which is a mixture of amorphous and polycrystalline states and a layer with a multi-crystalline state. In addition, as the functional layer 4b, a metal is also able to be used if the dissolution rate with regard to the conduction layer 4a is different, and if a different type of material to the conduction layer 4a, it is possible to use a material which includes at least one type selected from a group consisting of Ag, Al, Au, Pt, Pd, Ni, Cr, Nb, W, Mo, Ti and Cu.

It is preferable that the surface resistance of the laminate film 4 in the first region $R_1$ be 5000 Ω/opening or less. When exceeding 5000 Ω/opening, there is a tendency for the resistance to excessively increase and use as an electrode may not be possible.

[Configuration of Roll Base]

Figure 4A:
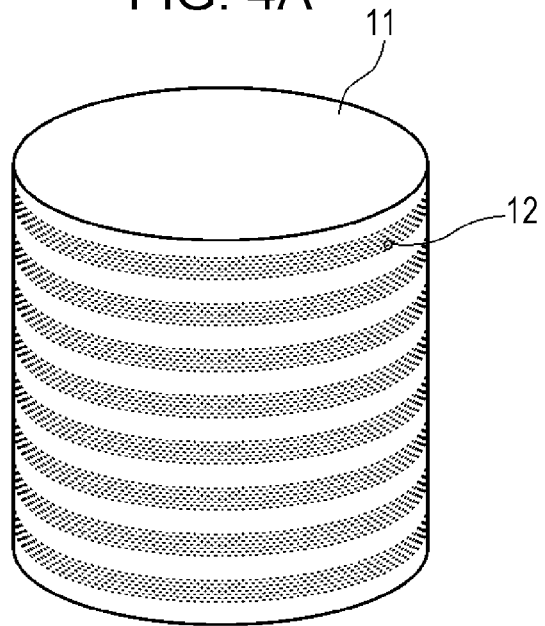
FIG. 4A is a perspective diagram illustrating one configuration example of a roll base for manufacturing a substrate.
Figure 4B:
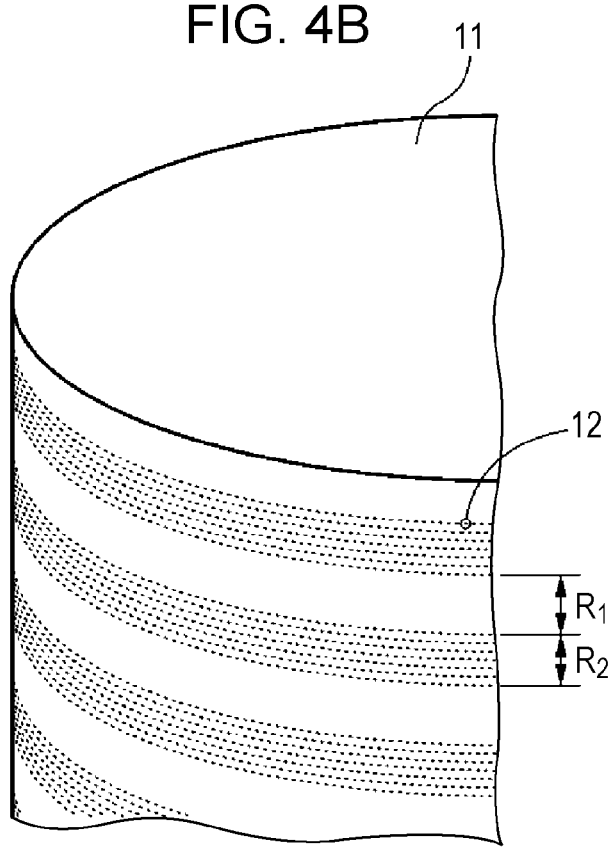
FIG. 4B is a perspective diagram representing an enlargement of a portion of the roll base illustrated in FIG. 4A.

FIG. 4A is a perspective diagram illustrating one configuration example of a roll base for manufacturing a substrate. FIG. 4B is a perspective diagram representing an enlargement of a portion of the roll base illustrated in FIG. 4A. A roll base 11 is a base for forming the structural bodies 3 on the substrate surface as described above. For example, the roll base 11 has a shape which is a circular column shape or a circular cylinder shape and the plurality of first regions $R_1$ and the second regions $R_2$ are set to alternate on the circular column surface or the circular cylinder surface. In FIGS. 4A and 4B, a case is shown where the first region $R_1$ and the second region $R_2$ head in a circumference direction and form a ring shape, but the shape of the first region $R_1$ and the second region $R_2$ is not limited to this example, and is appropriately selected according to the shape of the conduction pattern section which is necessary, that is, the shape of the laminate film 4 which is formed in the second region. As the material of the roll base 11, for example, it is possible to use glass but the material is not particularly limited.

Figure 5A:
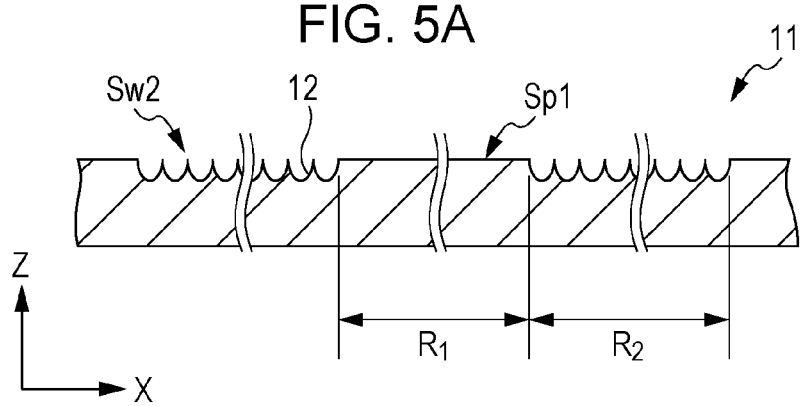
FIG. 5A is a cross-sectional diagram representing an enlargement of a portion of the roll base.
Figure 5B:
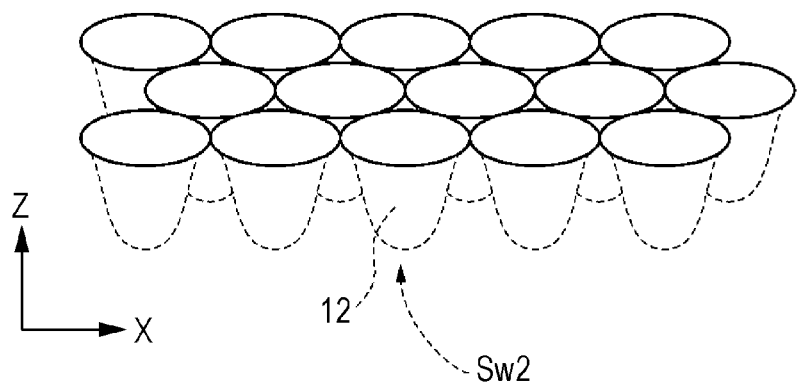
FIG. 5B is a perspective diagram illustrating an enlargement of a portion of the second region.
Figure 5C:
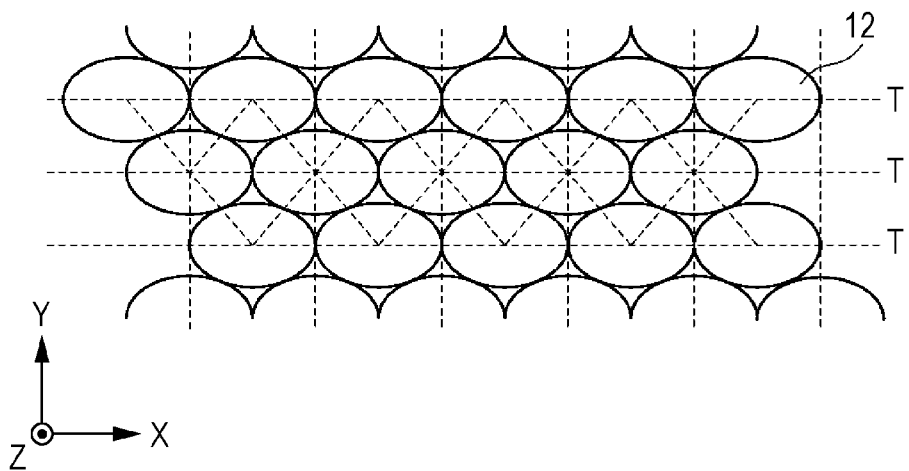
FIG. 5C is a planar diagram illustrating an enlargement of a portion of the second region.

FIG. 5A is a cross-sectional diagram representing an enlargement of a portion of the roll base. FIG. 5B is a perspective diagram illustrating an enlargement of a portion of the second region. FIG. 5C is a planar diagram illustrating an enlargement of a portion of the second region. For example, a plurality of structural bodies 12 which are concave sections are provided in the second region $R_2$ of the roll base 11 at a pitch which is the wavelength of visible light or less, while for example, the structural bodies 12 which are concave sections are not formed in the first region $R_1$ and the first region $R_1$ is a flat surface.

The first region $R_1$ and the second region $R_2$ of the roll base 11 respectively correspond to the first region $R_1$ and the second region $R_2$ of the substrate 2. That is, the flat surface Sp1 which is formed on the first region $R_1$ of the roll base 11 is for forming the flat surface Sp1 of the first region $R_1$ of the substrate 2. The wave surface Sw2 which is formed on the second region $R_2$ of the roll base 11 is for forming the wave surface Sw2 of the second region $R_2$ of the substrate 2. Specifically, the wave surface Sw2 of the roll base 11 has a shape which is the reverse of the concave and convex shape of the wave surface Sw2 on the surface of the substrate 2 described above. That is, the structural bodies 12 of the roll base 11 have a shape which is the reverse of the concave and convex shape of the structural bodies 3 on the surface of the substrate 2 described above.

[Configuration of Exposure Device]

Figure 6:
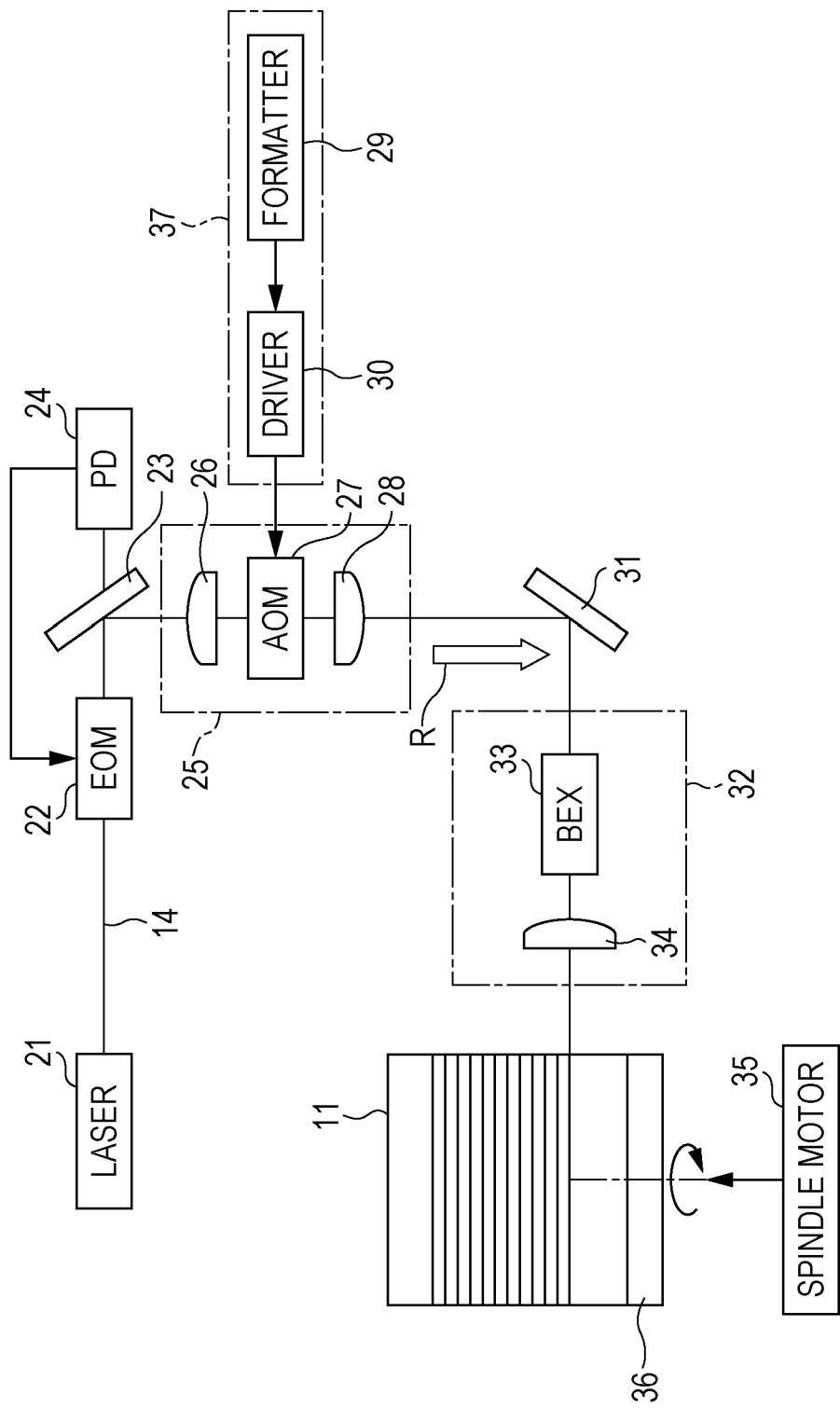
FIG. 6 is an outline diagram illustrating one configuration example of a roll base exposure device.

FIG. 6 is an outline diagram illustrating one configuration example of a roll base exposure device. Below, the configuration of the roll base exposure device will be described with reference to FIG. 6. Here, it is possible for the roll base exposure device to be, for example, configured with an optical disc recording device as a base.

The laser light source 21 is a light source for exposing a resist which is adhered as a film on the surface of the base 11 as a recording medium, and for example, oscillates laser light 14 for recording at a wavelength $\lambda=266$ nm. The laser light 14 which is emitted from the laser light source 21 progresses in this state as a parallel beam and is irradiated toward an electro optical modulator (EOM) 22. The laser light 14 which has passed through the electro optical modulator 22 is reflected by a mirror 23 and is lead to the modulation optical system 25.

The mirror 23 is a configuration using a polarized beam splitter and has a function where one component of polarization light is reflected and the other component of polarization light pass through. A photodiode 24 receives the light of the polarization component which has passed through the mirror 23 and phase modification of the laser light 14 is performed due to control of the electro optical modulator 22 based on the received light signal.

In the modulation optical system 25, the laser light 14 is collected in an acousto-optic modulator (AOM) 27 which is formed from glass ($SiO_2$) or the like using a light collecting lens 26. After being diffused by being strengthened and modified by the acousto-optic modulator 27, the laser light 14 is made to be a parallel beam using a lens 28. The laser light 14 which is emitted from the modulation optical system 25 is reflected by a mirror 31 and is led to a movement optical table 32 in a horizontal and parallel manner.

The movement optical table 32 is provided with a beam expander 33 and an object lens 34. After having been formed into a necessary beam shape using the beam expander 33, the laser light 14 which is led to the movement optical table 32 illuminates a resist layer on the base 11 via the object lens 34. The base 11 is placed on a turn table 36 which is connected to a spindle motor 35. Then, while the base 11 is rotated and the laser light 14 is moved in a height direction of the base 11, a resist layer exposure process is performed by the resist layer being intermittently illuminated by the laser light 14. The latent image which is formed is substantially an elliptical shape which has a long axis in the circumference direction. The movement of the laser light 14 is performed using the movement of the movement optical table 32 in the arrow R direction.

The exposure device is, for example, provided with a control mechanism 37 for forming a latent image on a resist layer corresponding to a predetermined two-dimensional pattern such as a four-direction grid shape or a six-directional grid shape. The control mechanism 37 is provided with a formatter 29 and a driver 30. The formatter 29 is provided with a polarity reversing section and the polarity reversing section controls the illumination timing of the laser light 14 with regard to the resist layer. The driver 30 controls the acousto-optic modulator 27 by receiving an output from the polarity reversing section.

In the roll base exposure device, a rotation controller of the recording device is synchronized with a polarity reversing formatter signal for each track so as to spatially link a two-dimensional pattern, a signal is generated, and is strengthened and modified using the acousto-optic modulator 27. It is possible to record a predetermined two-dimensional pattern such as a four-direction grid shape or a six-directional grid shape by patterning with an appropriate number of times of rotation, an appropriate modification frequency, and an appropriate sending pitch using constant angular velocity (CAV).

[Manufacturing Method of Conduction Element]

Below, one example of a manufacturing method of the conduction element 1 according to the first embodiment of the present disclosure will be described while referencing FIGS. 7A to 9C.

(Resist Depositing Process)

Figure 7A:
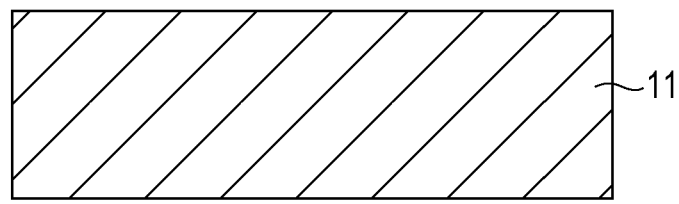
FIGS. 7A to 7C are process diagrams for describing one example of a manufacturing method of a conduction element according to the first embodiment of the present disclosure.
Figure 7B:
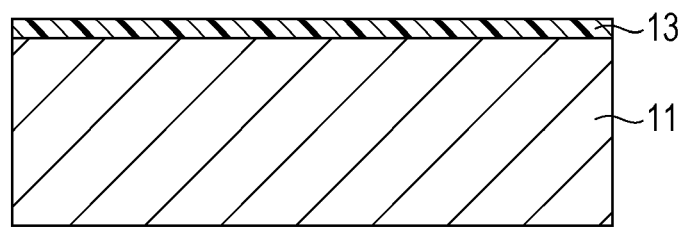

First, as shown in FIG. 7A, the roll base 11 with a circular column shape or a circular cylinder shape is prepared. The roll base 11 is, for example, a glass base. Next, as shown in FIG. 7B, a resist layer 13 is formed on a surface of the roll base 11. As the material for the resist layer 13, for example, either of an organic resist or an inorganic resist may be used. As the organic resist, for example, it is possible to use a novolac type resist or a chemical amplification type resist. In addition, as the inorganic resist, for example, it is possible to use one type or two or more types of metal compounds.

(Exposure Process)

Figure 7C:
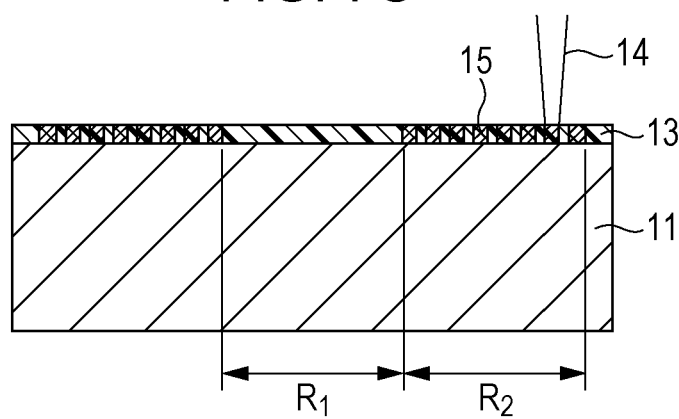

Next, as shown in FIG. 7C, using the roll base exposure device described above, the laser light (exposure beam) 14 is irradiated onto the resist layer 13 while the roll base 11 is rotated. At this time, the laser light 14 is irradiated while the laser light 14 is moved in the height direction of the roll base 11 (a direction which is parallel to the central axis of the roll base 11 which has a circular column shape or a circular cylinder shape). At this time, only the second region $R_2$ which corresponds to the insulating region between the wiring pattern is an exposure section where a latent image is formed, while the first region $R_1$ which corresponds to the conduction pattern section is not exposed and is a non-exposure section. A latent image 15 according to the trajectory of the laser light 14 is, for example, formed at a pitch which is the wavelength of visible light or less.

For example, the latent image 15 is disposed so that there is the plurality of rows of tracks in the roll base surface and forms a predetermined two-dimensional pattern such as a four-directional grid shape or a six-directional grid shape. The latent image 15 is, for example, an elliptical shape which has a long axial direction in an extension direction of the tracks.

(Development Process)

Figure 8A:
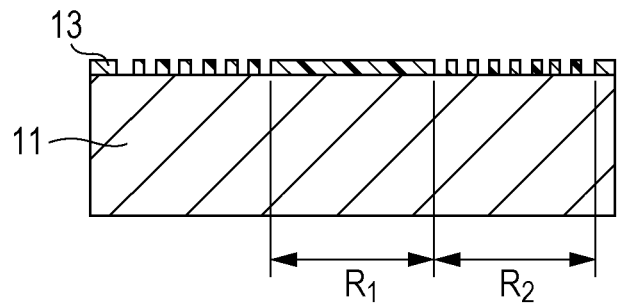
FIGS. 8A to 8C are process diagrams for describing one example of a manufacturing method of a conduction element according to the first embodiment of the present disclosure.

Next, for example, development liquid is dripped onto the resist layer 13 while the roll base 11 is rotated, and as shown in FIG. 8A, a development process is carried out on the resist layer 13. As shown in the diagram, in a case where the resist layer 13 is formed using a positive type resist, since the dissolution speed with regard to the development liquid is increased in the exposure section which is exposed using the laser light 14 compared to the non-exposure section, a pattern according to the latent image (exposure section) 15 is formed in the resist layer 13. Due to this, an opening section with a predetermined two-dimensional pattern such as a four-directional grid shape or a six-directional grid shape is formed in the resist layer 13 of the second region $R_2$, while the opening section is not formed in the resist layer 13 of the first region $R_1$ and the state where the entire first region $R_1$ is covered by the resist layer 13 is maintained. That is, a mask which has an opening pattern is formed on the roll base surface in only the second region $R_2$.

(Etching Process)

Figure 8B:
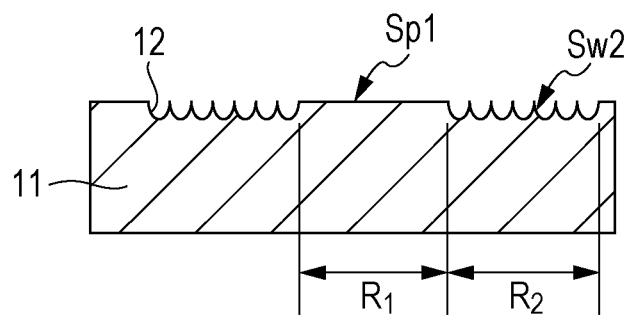

Next, a roll etching process is carried out on the surface of the roll base 11 with the pattern (resist pattern) of the resist layer 13 which is formed on the roll base 11 as a mask. Due to this, the etching progresses via the opening section in the second region $R_2$ out of the roll base surface, and as shown in FIG. 8B, the structural bodies (concave sections) 12 such as elliptical cone shapes or circular truncated cone shapes, which have a long axial direction in the extension direction of the tracks, are formed in the second region $R_2$. On the other hand, in the first region $R_1$ out of the roll base surface, since the entire region is covered by the resist layer 13, etching is not carried out and the flat surface shape of the roll base surface is maintained. As the etching method, for example, it is possible to use dry etching.

(Transfer Process)

Figure 8C:
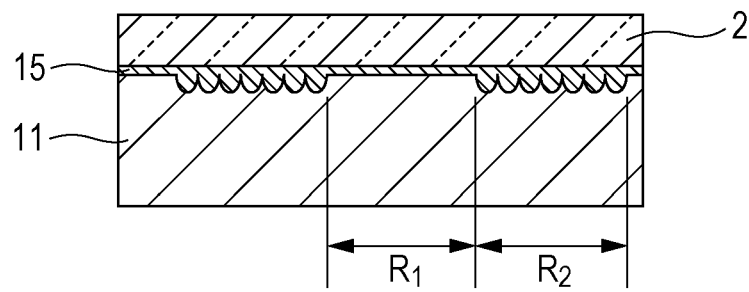
Figure 9A:
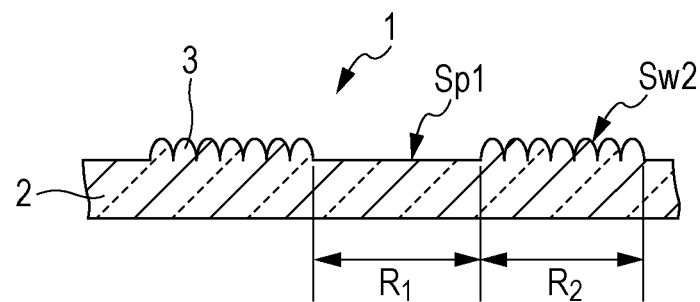
FIGS. 9A to 9C are process diagrams for describing one example of a manufacturing method of a conduction element according to the first embodiment of the present disclosure.

Next, for example, as shown in FIG. 8C, the substrate 2 such as a film where a transfer material 15 is coated is closely adhered to the roll base 11, and after the transfer material 15 is cured by irradiating energy rays such as ultraviolet rays, the substrate 2 which has become integrated with the transfer material 15 which has been cured is removed. Due to this, as shown in FIG. 9A, the substrate 2 which has the first region $R_1$ where the flat surface Sp1 is formed and the second region $R_2$ where the wave surface Sw2 is formed is able to obtained.

As the transfer material 15, for example, it is possible to use an energy ray curing resin compound. The energy ray curing resin compound is a resin compound which is able to be cured using the irradiation of energy rays. As the energy rays, energy rays are indicated which are able to become a trigger for a polymerization reaction such as radicals, cationics, or anionics such as electron rays, ultraviolet rays, infrared rays, laser light rays, visible light rays, ionizing radiation rays (X rays, $\alpha$ rays, $\beta$ rays, $\gamma$ rays, or the like), microwave rays, or high frequency rays. The energy ray curing resin compound may be used as a mixture with other resins as necessary and may be used as a mixture with another curing resin compound such as a heat curing resin compound. In addition, the energy ray curing resin compound may be an organic-inorganic hybrid material. In addition, two or more types of energy ray curing resin compounds may be mixed and used. As the energy ray curing resin compound, it is preferable to use an ultraviolet ray curing resin which is cured using ultraviolet rays.

The ultraviolet ray curing resin is, for example, a mono-function monomer, a bi-function monomer, or a multi-function monomer, and specifically, is a material shown below or a mixture thereof. It is possible to use, as the mono-function monomer, for example, carboxylic acids (acrylic acids), hydroxyl compounds (2-hydroxyethyl acrylate, 2-hydroxypropyl acrylate, 4-hydroxybutyl acrylate), alkyl, alicyclic compounds (isobutyl acrylate, t-butyl acrylate, iso-octyl acrylate, lauryl acrylate, stearyl acrylate, iso-bornyl acrylate, cyclohexyl acrylate), other functional monomers (2-methoxyethyl acrylate, methoxyethylene glycol acrylate, 2-ethoxyethyl acrylate, tetrahydrofurfuryl acrylate, benzyl acrylate, ethyl carbitol acrylate, phenoxyethyl acrylate, N,N-dimethylaminoethyl acrylate, N,N-dimethylaminopropylacryl amide, N,N-dimethylacrylamide, acryloylmorpholine, N-isopropyl acrylamide, N,N-diethyl acrylamide, N-vinyl pyrrolidone, 2-(perfluorooctyl)ethyl acrylate, 3-perfluorohexyl-2-hydroxypropyl acrylate, 3-perfluorooctyl-2-hydroxypropyl acrylate, 2-(perfluorodecyl)ethyl acrylate, 2-(perfluoro-3-methylbutyl)ethyl acrylate, 2,4,6-tribromophenol acrylate, 2,4,6-tribromophenol methacrylate, 2-(2,4,6-tribromophenoxy)ethyl acrylate), 2-ethylhexyl acrylate, and the like.

As the bi-function monomer, for example, it is possible to use tri(propylene glycol)diacrylate, trimethylolpropane diallyl ether, urethane acrylate, and the like.

As the multi-function monomer, for example, it is possible to use trimethylolpropane triacrylate, dipentaerythritol pentaacrylate, dipentaerythritol hexaacrylate, ditrimethylolpropane tetraacrylate, and the like.

As a starter agent, for example, it is possible to use 2,2-dimethoxy-1,2-diphenylethane-1-one, 1-hydroxyl-cyclohexylphenylketon, 2-hydroxyl-2-methyl-1-phenlypropane-1-one, and the like.

With regard to the energy ray curing resin compound such as the ultraviolet ray curing resin, a filler or a functional additive agent may be added. As the filler, for example, it is possible to use inorganic micro particles or organic micro particles. As the inorganic micro particles, for example, it is possible to use metal oxide micro particles such as $SiO_2$, $TiO_2$, $ZrO_2$, $SnO_2$, or $Al_2O_3$. As the functional additive agent, for example, it is possible to use a leveling agent, a surface adjusting agent, a bubble preventing agent, or the like.

As the material of the substrate 2, for example, there is methyl methacrylate (co)polymer, polycarbonate, styrene (co)polymer, methyl methacrylate-styrene copolymer, cellulose diacetate, cellulose triacetate, cellulose acetate butyrate, polyester, polyamide, polyimide, polyether sulfone, polysulfone, polypropylene, polymethyl pentene, polyvinyl chloride, polyvinyl acetal, polyether ketone, polyurethane, glass, or the like.

The forming method of the substrate 2 is not particularly limited, and for example, it is possible to use an injection molding method, an extrusion molding method, a cast molding method, or the like. A surface treatment such as a corona treatment may be carried out on the substrate surface as necessary.

(Depositing Process of Laminate Film)

Figure 9B:
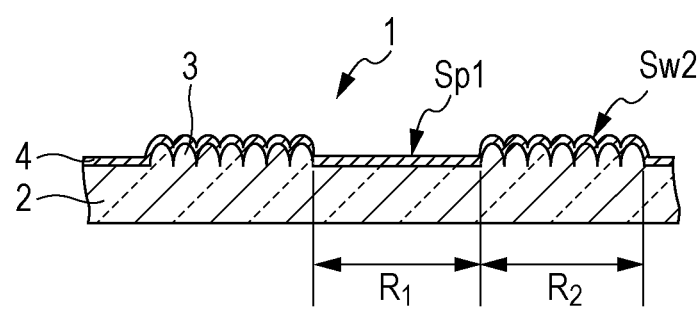

Next, as shown in FIG. 9B, the laminate film 4 is formed by laminating two or more layers on the first region $R_1$ and the second region $R_2$ on the substrate surface. Specifically, for example, the laminate film 4 is formed by the conduction layer 4a and the functional layer 4b being laminated in this order on the first region $R_1$ and the second region $R_2$ on the substrate surface. As the depositing method of the laminate film 4, for example, other than a CVD method (Chemical Vapor Deposition: a technique where a thin film is deposited from a gas phase using a chemical reaction) such as heat CVD, plasma CVD, or light CVD, it is possible to use a PVD method (Physical Vapor Deposition: a technique where a material which is physically gasified in a vacuum is condensed on the substrate and a thin film is formed) such as vacuum evaporation, plasma deposition, sputtering, or ion plating. In addition, the laminated film 4 may be formed while the substrate 2 is being heated.

(Annealing Process)

Next, an annealing process is carried out with regard to the laminate film 4 as necessary. Due to this, the laminate film 4 or the inorganic transparent conduction layer which is included in the laminate film 4 is, for example, in a mixture of amorphous and polycrystalline states.

(Laminate Film Removal Process)

Figure 9C:
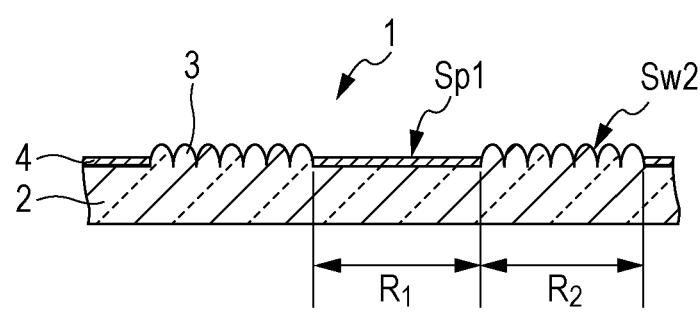

Next, as shown in FIG. 9C, an etching process is carried out with regard to the substrate surface where the laminate film 4 is formed. Due to this, the laminate film 4 remains in the first region $R_1$ while the laminate film 4 is removed in the second region $R_2$. Specifically, for example, the conduction layer 4a and the functional layer 4b remain in the first region $R_1$ while the conduction layer 4a and the functional layer 4b are removed in the second region $R_2$. Accordingly, the laminate film 4 which is formed in the first region $R_1$ functions as the conduction pattern section and the second region $R_2$ functions as the insulating region between the conduction pattern section. As the etching process, it is possible to use wet etching or dry etching, and both may be combined and used. As the etching liquid of the wet etching, for example, it is possible to use one or more type from sulfuric acid, hydrochloric acid, nitric acid, or ferric chloride. In addition, oxalic acid, an acid mixture of acetic acid, phosphoric acid, and nitric acid, and an aqueous solution of cerium ammonium nitrate may be used as the etching liquid. As the dry etching, it is possible to use plasma etching or reactive ion etching (RIE).

Here, as removal, there is the meanings of (1) the laminate film 4 is completely taken from the second region $R_2$, (2) the laminate film 4 is in a non-continuous state (for example, a state of islands) to the extent that conductivity is not exhibited in the second region $R_2$, and (3) the laminate film 4 is thinned to a thinness to the extent that conductivity is not exhibited in the second region $R_2$.

Specifically, it is preferable that the laminate film 4 which is formed on the flat surface Sp1 remains so as to be connected in a continuous manner while the laminate film 4 which is formed on the wave surface Sw2 is removed in practice using a difference such as the film properties, phase state, or the like of the laminate film 4 which is formed on the flat surface Sp1 and the wave surface Sw2. Due to this, it is possible for the conduction pattern section to be selectively formed on the flat surface Sp1 out of the flat surface Sp1 and the wave surface Sw2.

In addition, it is preferable that the laminate film 4 which is formed on the flat surface Sp1 remains so as to be connected in a continuous manner while the laminate film 4 which is formed on the wave surface Sw2 is removed and is in a non-continuous state such as an island state using a difference such as the film properties, phase state, or the like of the laminate film 4 which is formed on the flat surface Sp1 and the wave surface Sw2. Due to this, it is possible for the conduction pattern section to be selectively formed on the flat surface Sp1 out of the flat surface Sp1 and the wave surface Sw2.

In addition, it is preferable that the thickness of the laminate film 4 which is formed on the wave surface Sw2 be considerably thinned compared to the thickness of the laminate film 4 which is formed on the flat surface Sp1 using a difference such as the film properties, phase state, or the like of the laminate film 4 which is formed on the flat surface Sp1 and the wave surface Sw2. Due to this, it is possible for the conduction pattern section to be selectively formed on the flat surface Sp1 out of the flat surface Sp1 and the wave surface Sw2.

(Washing Process)

Next, the substrate surface where the etching process was carried out is washed as necessary.

Due to the above, the conduction element 1 which is the aim is able to be obtained.

In the first embodiment, the laminate film 4 is formed by two or more layers being laminated with regard to the substrate surface which has the flat surface Sp1 and the wave surface Sw2. Then, out of the flat surface Sp1 and the wave surface Sw2, the conduction pattern section is formed by the laminate film 4 which is formed on the flat surface Sp1 remaining while the laminate film 4 which is formed on the wave surface Sw2 is removed using a difference of the states of the laminate film 4 which is formed on the flat surface Sp1 and the wave surface Sw2. In this way, the conduction element 1 with high accuracy and with throughput can be realized.

2. Second Embodiment

Configuration of Conduction Element

Figure 10A:
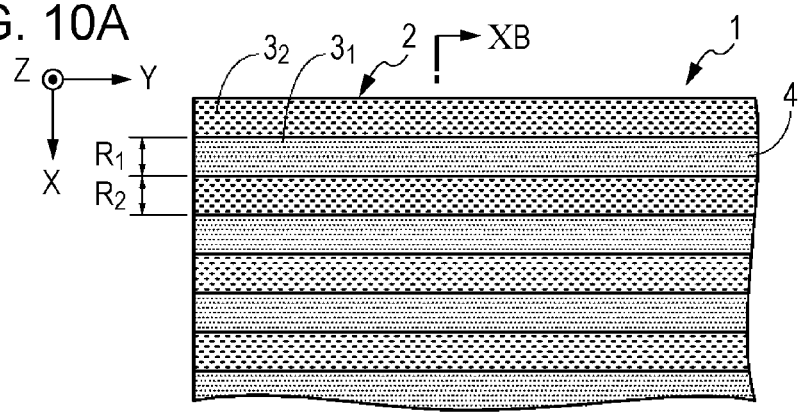
FIG. 10A is a planar diagram illustrating one configuration example of a conduction element according to a second embodiment of the present disclosure.

FIG. 10A is a planar diagram illustrating one configuration example of the conduction element according to a second embodiment of the present disclosure.

Figure 10B:
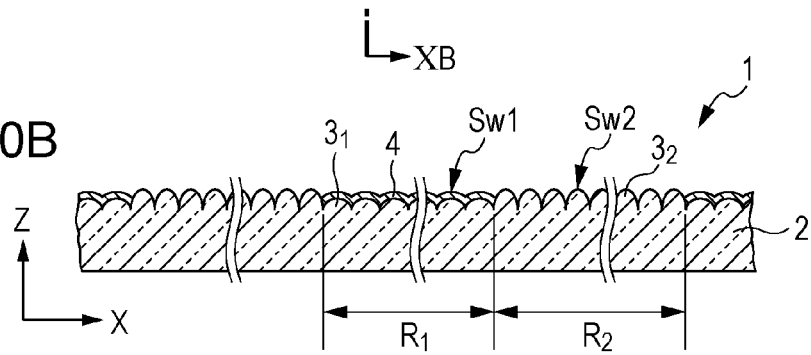
FIG. 10B is a cross-sectional diagram along a line XB-XB shown in FIG. 10A.
Figure 10C:
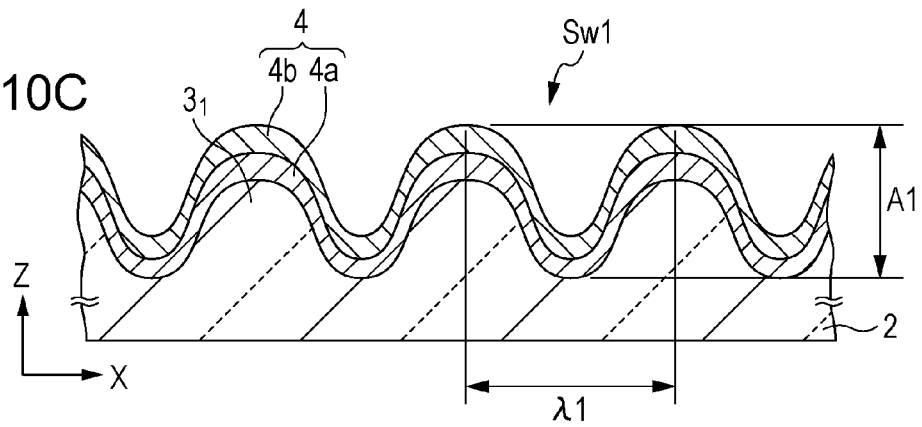
FIG. 10C is a cross-sectional diagram which represents an enlargement of a portion of a first region illustrated in FIG. 10B.
Figure 10D:
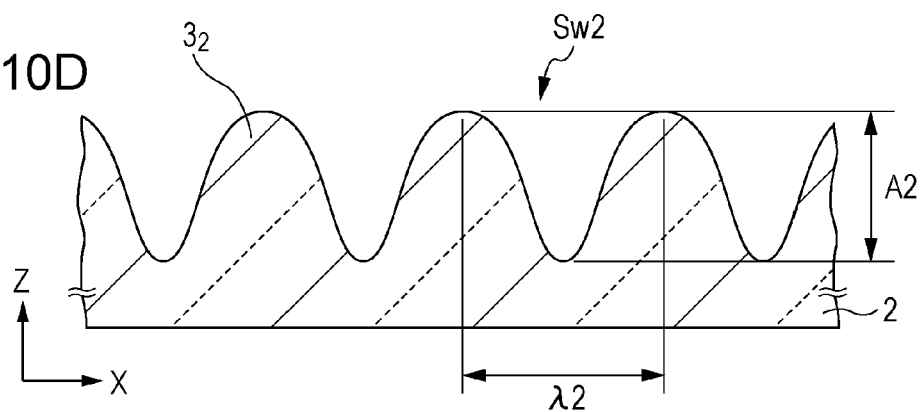
FIG. 10D is a cross-sectional diagram which represents an enlargement of a portion of a second region illustrated in FIG. 10B.

FIG. 10B is a cross-sectional diagram along a line XB-XB shown in FIG. 10A. FIG. 10C is a cross-sectional diagram which represents an enlargement of a portion of the first region illustrated in FIG. 10B. FIG. 10D is a cross-sectional diagram which represents an enlargement of a portion of the second region illustrated in FIG. 10B. The conduction element 1 according to the second embodiment is different to the first embodiment in regard to the point that the wiring pattern and the like is formed by changing the etching speed of the laminate film 4 which is formed in the first region $R_1$ and the second region $R_2$ using a difference (for example, a difference in the average width of vibration) in a first wave surface Sw1 which is formed in the first region $R_1$ and a second wave surface Sw2 which is formed in the second region $R_2$.

(First Region and Second Region)

The first wave surface Sw1 is formed in the surface of the substrate in the first region $R_1$ and the laminate film 4 is formed in a continuous manner on the first wave surface Sw1. On the other hand, the second wave surface Sw2 is formed in the surface of the substrate in the second region $R_2$ and there is a state where the laminate film 4 is not formed on the second wave surface Sw2. The first wave surface Sw1 and the second wave surface Sw2 are, for example, wave surfaces which is the wavelength of visible light or less. Accordingly, the region $R_2$ functions as an insulating region for insulating between the laminate film 4 which is formed on the first regions $R_1$ which are adjacent. With regard to this, the laminate film 4 which is formed on the first region $R_1$ in a continuous manner has conductivity toward an extension direction of the first region $R_1$ and functions as the conduction pattern section.

In addition, it is preferable that the average wavelength $\lambda m1$ of the wave surface Sw1 and the average wavelength $\lambda m2$ of the wave surface Sw2 be in the range of 100 μm or less. When the average wavelength $\lambda m1$ and the average wavelength $\lambda m2$ exceed 100 μm, there are problems with steps and coverage during imprinting and film formation and defects occur.

It is preferable that the laminate film 4 be formed to follow the surface shape of a first structural body $3_1$ so that the reflection preventing effect is not hampered due to the first structural body $3_1$ in the first region $R_1$ and the surface shape of the first structural body $3_1$ and the laminate film 4 has substantially a similar shape. This is because change in the refractive index profile due to the shape of the laminate film 4 is suppressed and it is possible to maintain the superior reflection preventing properties or transparent properties. It is preferable that the material which configures the laminate film 4 be a mixture of amorphous and polycrystalline states. This is because, in a case where the height of the first structural body $3_1$ is low, it is possible to form the laminate film 4 with a film thickness so that the reflection preventing effect of the first structural body $3_1$ is not hampered. That is, this is because a shape where the laminate film 4 follows the shape in the first structural body $3_1$ is able to be maintained.

It is preferable that the ratio (Am2/λm2) of the average width of vibration Am2 with regard to the average wavelength λm2 of the second wave surface Sw2 is larger than the ratio (Am1/λm1) of the average width of vibration Am1 with regard to the average wavelength λm1 of the first wave surface Sw1. This is because, due to this, compatibility of optical properties and electrical selectivity is possible. Specifically, it is preferable that the ratio (Am1/λm1) and the ratio (Am2/λm2) satisfy the relationship below.

$$0 \leq (Am1/\lambda m1) < (Am2/\lambda m2) \leq 1.8$$

(Here, Am1: average width of vibration in the first wave surface Sw1, Am2: average width of vibration in the second wave surface Sw2, λm1: average wavelength of the first wave surface Sw1, λm2: average wavelength of the second wave surface Sw2)

When the ratio (Am2/λm2) is less than 1.8, there is a tendency for there to be peeling defects when transferring the wave surface Sw2 and for the wave surface Sw2 to be damaged.

Here, the ratio (Am1/λm1) of the wave surface Sw1 is measured in the same manner as the wave surface Sw2 in the first embodiment.

It is possible for the shape, the wavelength, and the width of vibration of the wave surface Sw1 and the wave surface Sw2 to be each selected independently. Specifically, for example, it is possible for the wave surface Sw1 and the wave surface Sw2 to each be separate wave surfaces which are one-dimensional or two-dimensional. In addition, it is possible for the wavelengths and the widths of vibration of the wave surface Sw1 and the wave surface Sw2 are each independently set as wavelengths or widths of vibration in a nano order or a micro order.

It is preferable that any portion of the laminate film 4 be not present at all as remaining film in the second region $R_2$, but may be present as remaining film if it is to the extent that the second region $R_2$ functions as an insulating region. In this case, it is preferable that the area of the laminate film 4 which is formed in the first region $R_1$ be larger than the laminate film 4 or a portion thereof which is formed in the second region $R_2$. Specifically, it is preferable that the laminate film 4 be formed in a continuous manner in the first region $R_1$ while the laminate film 4 or a portion thereof be formed in a non-continuous manner such as an island shape in the second region $R_2$. In addition, the thickness of the laminate film 4 or a portion thereof which is formed in the second region $R_2$ may be thinner than the thickness of the laminate film 4 which is formed in the first region $R_1$ to the extent that conductivity is not exhibited in practice and the second region $R_2$ functions as an insulating region.

(Structural Body)

The first wave surface Sw1 is, for example, a concave and convex surface where a plurality of first structural bodies $3_1$ are formed at an arrangement pitch which is the wavelength of visible light or less. The second wave surface Sw2 is, for example, a concave and convex surface where a plurality of second structural bodies $3_2$ are formed at an arrangement pitch which is the wavelength of visible light or less. It is preferable that an average aspect ratio (Hm1/Pm1) of the first structural body $3_1$ be larger than an average aspect ratio (Hm2/Pm2) of the second structural body $3_2$. Specifically, it is preferable that the first structural body $3_1$ and the second structural body $3_2$ satisfy the relationship below.

$$0<(Hm1/Pm1)<(Hm2/Pm2)\leq1.8$$

(Here, Hm1: average height of the first structural body $3_1$, Hm2: average height of the second structural body $3_2$, Pm1: average arrangement pitch of the first structural body $3_1$, Pm2: average arrangement pitch of the second structural body $3_2$)

When the ratio (Hm2/Pm2) is greater than 1.8, there is a tendency for there to be peeling defects when transferring the second structural body $3_2$ and for the second structural body $3_2$ to be damaged.

Here, the aspect ratio (Hm1/Pm1) of the first structural body $3_1$ and the aspect ratio (Hm2/Pm2) of the second structural body $3_2$ are measured in the same manner as the aspect ratio (Hm/Pm) of the structural bodies 3 in the first embodiment.

With regard to the first structural body $3_1$ and the second structural body $3_2$, it is possible for other than that described above to be the same as the structural bodies 3 in the first embodiment. Here, it is not necessary for the arrangement patterns, the shapes, and the like of the first structural body $3_1$ and the second structural body $3_2$ to be the same and the arrangement patterns, the shapes, and the like of both structural bodies which are different may be taken.

[Configuration of Roll Base]

Figure 11A:
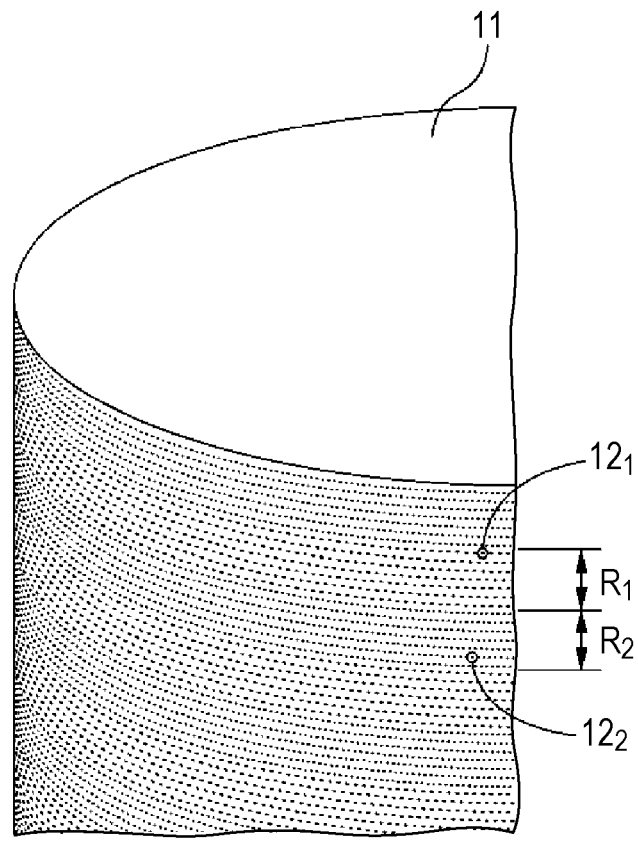
FIG. 11A is a perspective diagram illustrating one configuration example of a roll base for manufacturing a substrate.
Figure 11B:
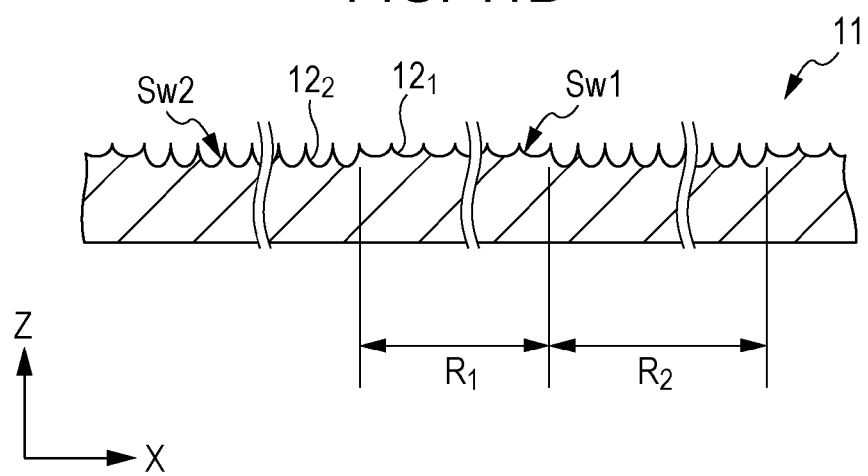
FIG. 11B is a cross-sectional diagram representing an enlargement of a portion of the roll base illustrated in FIG. 11A.

FIG. 11A is a perspective diagram illustrating one configuration example of the roll base for manufacturing the substrate 2. FIG. 11B is a cross-sectional diagram representing an enlargement of a portion of the roll base illustrated in FIG. 11A. The roll base 11 according to the second embodiment is different to the first embodiment in the point where the first wave surface Sw1 and the second wave surface Sw2 are provided in both regions of the first region $R_1$ and the second region $R_2$.

The first wave surface Sw1 of the roll base 11 is, for example, formed due to a first structural body $12_1$ with a concave shape being arranged at a pitch which is the wavelength of visible light or less. The second wave surface Sw2 of the roll base 11 is, for example, formed due to a second structural body $12_2$ with a concave shape being arranged at a pitch which is the wavelength of visible light or less. The first wave surface Sw1 and the second wave surface Sw2 of the roll base 11 each have a shape which is the reverse of the concave and convex of the first wave surface Sw1 and the second wave surface Sw2 of the substrate 2.

The first region $R_1$ and the second region $R_2$ of the roll base 11 respectively correspond to the first region $R_1$ and the second region $R_2$ of the substrate 2. That is, the first structural body $12_1$ with a concave shape which is formed on the first region $R_1$ of the roll base 11 is for forming the first structural body $3_1$ with a convex shape which is formed in the first region $R_1$ of the substrate 2. The second structural body $12_2$ with a concave shape which is formed on the second region $R_2$ of the roll base 11 is for forming the second structural body $3_2$ with a convex shape which is formed in the second region $R_2$ of the substrate 2. It is preferable that the aspect ratio of the second structural body $12_2$ is large compared to the aspect ratio of the first structural body $12_1$.

[Manufacturing Method of Conduction Element]

In the etching process of the second embodiment, the laminate film 4 remains in the first region $R_1$ while the laminate film 4 is removed in the second region $R_2$ due to the etching process being carried out with regard to the substrate surface where the laminate film 4 is formed. Specifically, it is preferable that the laminate film 4 which is formed on the first wave surface Sw1 remains so as to be connected in a continuous manner while the laminate film 4 which is formed on the second wave surface Sw2 is removed in practice using a difference such as the film properties, phase state, or the like of the laminate film 4 which is formed on the first wave surface Sw1 and the second wave surface Sw2. Due to this, it is possible for the conduction pattern section to be selectively formed on the first wave surface Sw1 out of the first wave surface Sw1 and the second wave surface Sw2.

In addition, it is preferable that the laminate film 4 which is formed on the first wave surface Sw1 remains so as to be connected in a continuous manner while the laminate film 4 which is formed on the second wave surface Sw2 is removed and is in a non-continuous state such as an island state using a difference such as the film properties, phase state, or the like of the laminate film 4 which is formed on the first wave surface Sw1 and the second wave surface Sw2. Due to this, it is possible for the conduction pattern section to be selectively formed on the first wave surface Sw1 out of the first wave surface Sw1 and the second wave surface Sw2.

In addition, it is preferable that the thickness of the laminate film 4 which is formed on the second wave surface Sw2 is considerably thinned compared to the thickness of the laminate film 4 which is formed on the first wave surface Sw1 using a difference such as the film properties, phase state, or the like of the laminate film 4 which is formed on the first wave surface Sw1 and the second wave surface Sw2. Due to this, it is possible for the conduction pattern section to be selectively formed on the first wave surface Sw1 out of the first wave surface Sw1 and the second wave surface Sw2.

In the second embodiment, since the first structural body $3_1$ and the second structural body $3_2$ are formed in each of both regions of the first region $R_1$ and the second region $R_2$, it is possible to improve the reflection preventing characteristics of the conduction element 1. In a case of a configuration such as this, it is preferable that the laminate film 4 of the first region $R_1$ which functions as the conduction pattern section be a shape which follows the shape of the first structural body $3_1$ which is formed in the first region $R_1$. This is because, due to this, it is possible to suppress a reduction in the effect of the reflection preventing properties and/or the transparency properties.

The wave surface where modulation has been carried out (for example, amplitude modulation and/or frequency modulation) is formed on the substrate surface and it is possible to change the state of the laminate film 4 according to a difference in the modulation of the wave surfaces of the substrate 2 by the laminate film 4 being formed on the substrate surface. Accordingly, it is possible to change the dissolution rate of the laminate film 4 with regard to the etching liquid according to a difference in the modulation of the wave surfaces of the substrate 2. That is, it is possible to form the desired conduction pattern section on the substrate surface using a difference in the modulation of the wave surfaces of the substrate 2.

In a case where the wave surface on the substrate surface is formed using nano structural bodies, it is possible for the visibility and the optical properties to be improved. It is possible for the desired electrical resistance to be realized without deterioration in optical properties.

In the information input device in the related art where a wiring line formed from a conduction layer is formed on the substrate surface (for example, digital type resistance touch panel, an electrostatic capacitance type touch panel, and the like), there is a tendency for the wiring line to be seen and for display quality to deteriorate since the reflectivity of the conduction layer and the substrate are different. On the other hand, in the information input device according to the embodiment of the present disclosure, it is possible to suppress visibility of the wiring line since low reflection and high transmissivity are realized irrespective of the presence or absence of the laminate film 4.

3. Third Embodiment

Figure 12A:
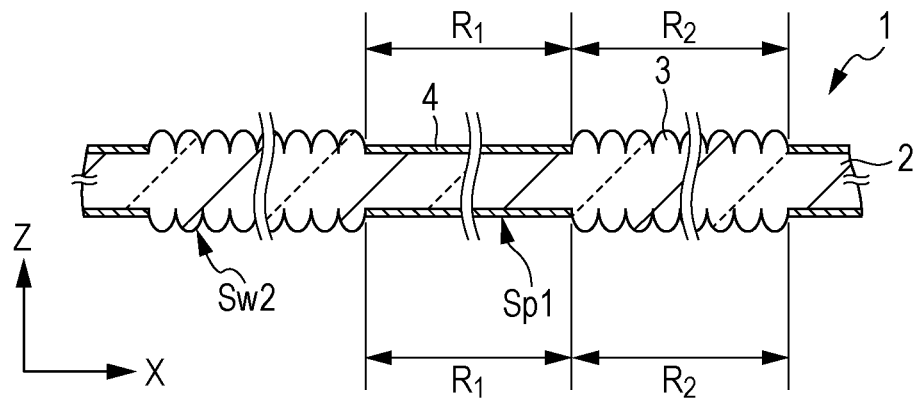
FIG. 12A is a cross-sectional diagram illustrating one configuration example of a conduction element according to a third embodiment of the present disclosure.
Figure 12B:
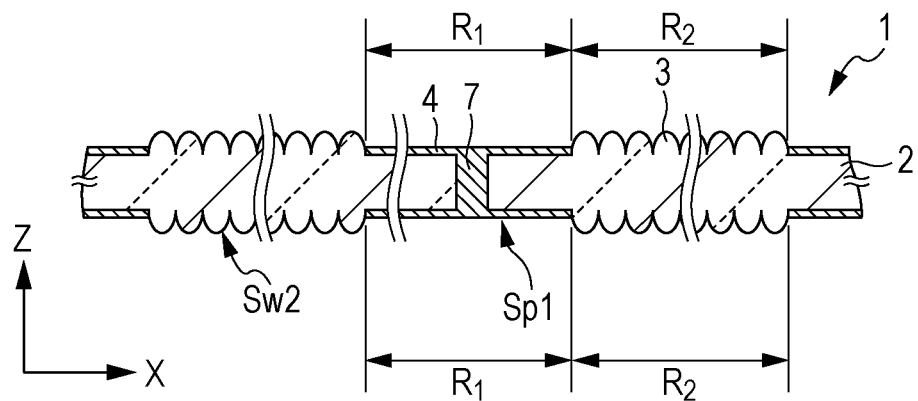
FIG. 12B is a cross-sectional diagram illustrating a modified example of the conduction element according to the third embodiment of the present disclosure.

FIG. 12A is a cross-sectional diagram illustrating one configuration example of a conduction element according to a third embodiment of the present disclosure. The conduction element 1 according to the third embodiment is different to the first embodiment in the point that the first region $R_1$ and the second region $R_2$ are set on both main surfaces of the substrate 2 and the conduction pattern section is formed on both surfaces of the substrate 2 due to the laminate film 4 being formed in a continuous manner only in the first region $R_1$ out of both regions. In addition, as shown in FIG. 12B, a through hole is formed in the first region $R_1$ of the substrate 2, the through hole is filled in by a conductive material such as a conductive ink, and the conduction pattern section such as a circuit which is formed on both surfaces of the substrate 2 may be electrically connected.

In the third embodiment, it is possible for more circuits and the like to be mounted on the conduction elements 1 than in the first embodiment since the conduction pattern section is formed on both surfaces of the substrate 2.

4. Fourth Embodiment

Figure 13A:
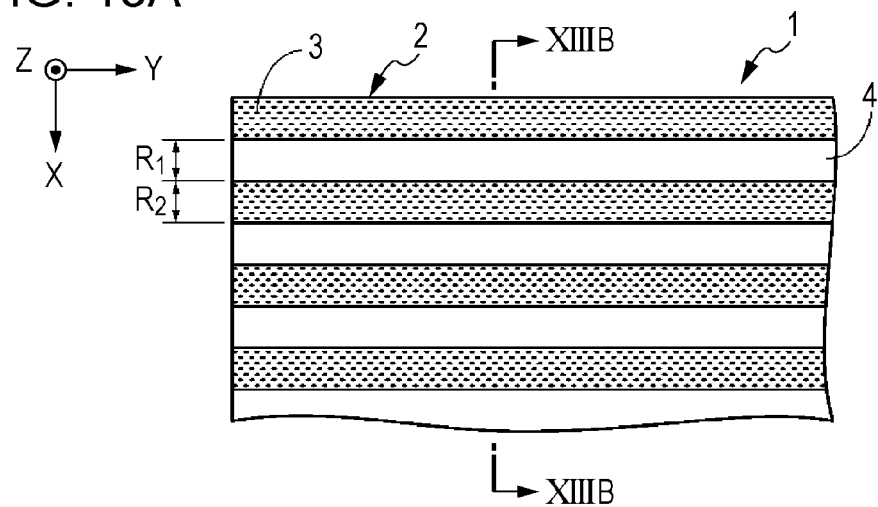
FIG. 13A is a planar diagram illustrating one configuration example of a conduction element according to a fourth embodiment of the present disclosure.
Figure 13B:
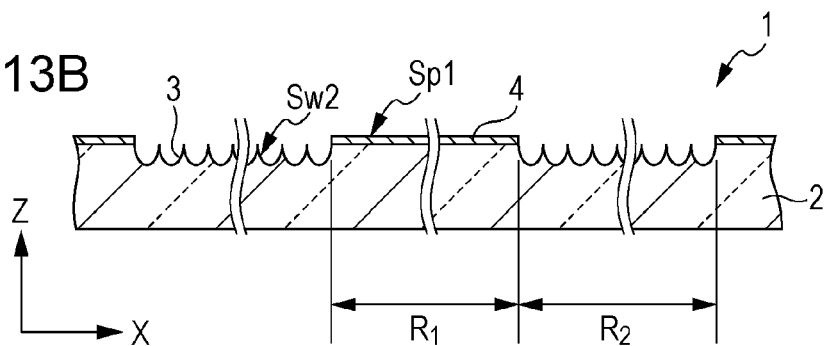
FIG. 13B is a cross-sectional diagram along a line XIIIB-XIIIB shown in FIG. 13A.
Figure 13C:
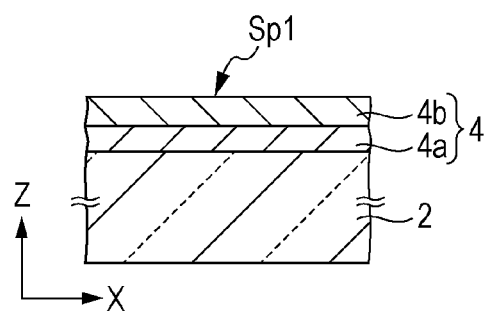
FIG. 13C is a cross-sectional diagram which represents an enlargement of a portion of a first region illustrated in FIG. 13B.
Figure 13D:
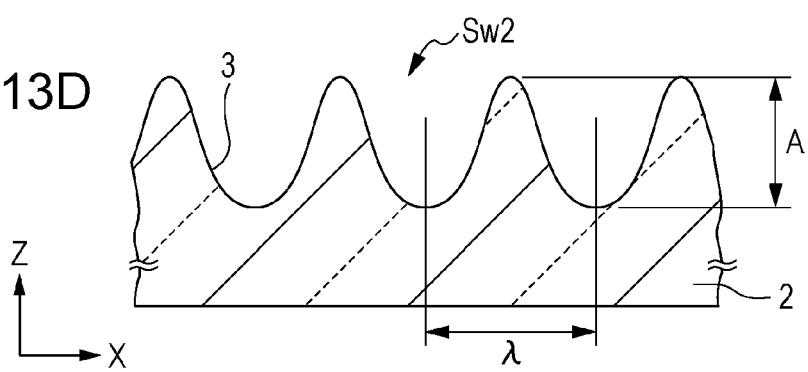
FIG. 13D is a cross-sectional diagram which represents an enlargement of a portion of a second region illustrated in FIG. 13B.

FIG. 13A is a planar diagram illustrating one configuration example of a conduction element according to a fourth embodiment of the present disclosure. FIG. 13B is a cross-sectional diagram along a line XIIIB-XIIIB shown in FIG. 13A. FIG. 13C is a cross-sectional diagram which represents an enlargement of a portion of the first region illustrated in FIG. 13B. FIG. 13D is a cross-sectional diagram which represents an enlargement of a portion of the second region illustrated in FIG. 13B. The conduction element 1 according to the fourth embodiment is different to the first embodiment in the point that the plurality of structural bodies 3 with a concave shape are arranged in the second region $R_2$ on the substrate surface.

Other than this, the fourth embodiment is the same as the first embodiment.

In the fourth embodiment, it is possible to obtain the same effects as the first embodiment since the shape of the structural bodies 3 with a convex shape in the first embodiment become concave shapes when reversed.

5. Fifth Embodiment

Figure 14:
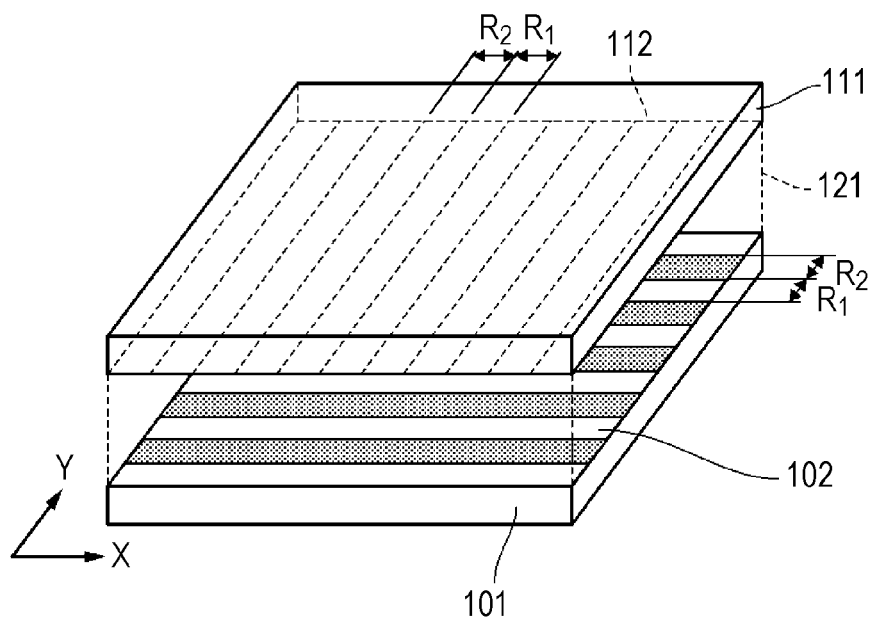
FIG. 14 is a perspective diagram illustrating one configuration example of a liquid crystal display element according to a fifth embodiment of the present disclosure.

FIG. 14 is a perspective diagram illustrating one configuration example of a liquid crystal display element according to a fifth embodiment of the present disclosure. As shown in FIG. 14, the liquid crystal display element is a display element of a passive matrix driving type (also referred to as a simple matrix driving type) and is provided with a first substrate base 101 and a second substrate base 111 which are disposed so as to oppose and be separated by a predetermined gap and a liquid crystal layer 121 which is disposed between the first substrate base 101 and the second substrate base 111.

Out of both main surfaces of the first substrate base 101, the first region $R_1$ and the second region $R_2$ with linear shapes are repetitively set to alternate on one main surface which opposes the second substrate base 111. The surface configuration of the first substrate base 101 in regard to the first region $R_1$ and the second region $R_2$ is the same as the surface configuration of the substrate in the conduction element of any of the first to the fourth embodiments described above. For example, the first substrate base surface in the first region $R_1$ is a wave surface where a plurality of structural bodies are formed at an arrangement pitch which is the wavelength of visible light or less and the remaining film is formed in a non-continuous manner such as an island state. On the other hand, in the second region $R_2$, the structural bodies are not formed, the second region $R_2$ is a flat surface, and the laminate film is formed in a continuous manner. Accordingly, out of both main surfaces of the first substrate base 101, a plurality of horizontal (X) electrodes (first electrodes) 102 formed from a laminate film which is formed in a continuous manner are formed in strip shapes in the one main surface which opposes the second substrate base 111.

Out of both main surfaces of the second substrate base 111, the first region $R_1$ and the second region $R_2$ with linear shapes are repetitively set to alternate on one main surface which opposes the first substrate base 101. The surface configuration of the second substrate base 111 in regard to the first region $R_1$ and the second region $R_2$ is the same as the surface configuration of the substrate in the conduction element of any of the first to the fourth embodiments described above. For example, the second substrate base surface in the first region $R_1$ is a wave surface where a plurality of structural bodies are formed at an arrangement pitch which is the wavelength of visible light or less and the remaining film is formed in a non-continuous manner such as an island state. On the other hand, in the second region $R_2$, the structural bodies are not formed, the second region $R_2$ is a flat surface, and the laminate film is formed in a continuous manner. Accordingly, out of both main surfaces of the second substrate base 111, a plurality of vertical (Y) electrodes (second electrodes) 112 formed from a laminate film which is formed in a continuous manner are formed in strip shapes in the one main surface which opposes the first substrate base 101.

The first region $R_1$ and the second region $R_2$ on the first substrate base 101 and the second substrate base 111 are in a relationship of intersecting each other. That is, the horizontal electrode 102 on the first substrate base 101 and the vertical electrode 112 on the second substrate base 111 are in a relationship of intersecting each other.

In the fifth embodiment, for example, it is possible for an electrode of the liquid crystal display element to be manufactured using the presence or absence of the wave surface or the presence or absence of the structural bodies. In addition, in a case where, for example, the wavelength of the wave surface or the arrangement pitch of the structural bodies are the wave length of visible light or less, it is possible for the reflection preventing properties and/or the transparency properties of the liquid crystal display element to be improved.

In addition, as in the second embodiment described above, structural bodies where the aspect ratio or the like is different may be formed in each of the first region $R_1$ and the second region $R_2$. Due to this, it is possible to further improve the reflection preventing properties and/or the transparency properties of the liquid crystal display element. In a configuration such as this, it is preferable that the transparent laminate film in the second region $R_2$ which functions as the horizontal electrode 102 and the vertical electrode 112 be a shape which follows the shape of the structural bodies which are formed in the second region $R_2$. This is because, due to this, it is possible to suppress a reduction in the effect of reflection preventing and/or transparency properties using the structural bodies.

6. Sixth Embodiment

Figure 15:
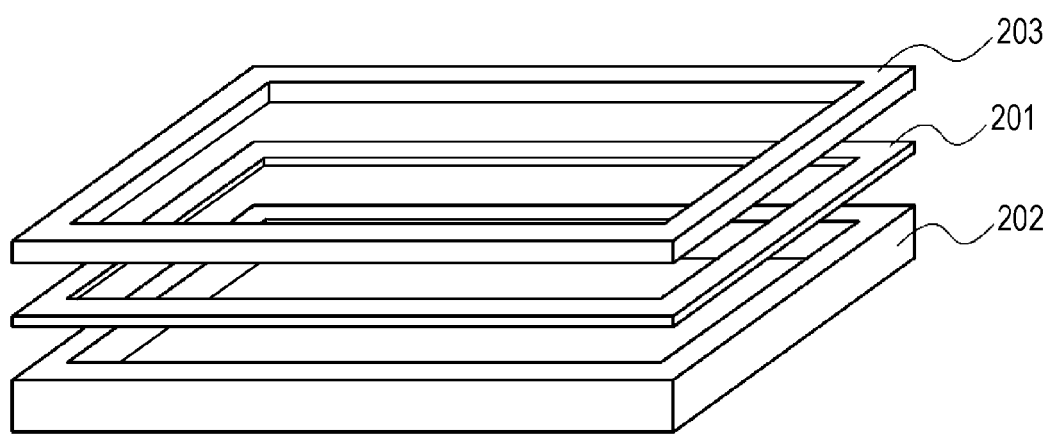
FIG. 15 is a perspective diagram illustrating one configuration example of a display device which is provided with a touch panel according to a sixth embodiment of the present disclosure.

FIG. 15 is a perspective diagram illustrating one configuration example of a display device which is provided with a touch panel according to a sixth embodiment of the present disclosure. As shown in FIG. 15, a touch panel (information input device) 201 is provided on a display device 202. The display device 202 and the touch panel 201 are, for example, bonded via an adhesive agent. In addition, a front panel (surface member) 203 may be further provided on the surface of the touch panel 201. The touch panel 201 and the front panel (surface member) 203 are, for example, bonded via an adhesive agent.

As the display device 202, for example, it is possible to use various types of display devices such as a liquid crystal display, a CRT (Cathode Ray Tube) display, a PDP (Plasma Display Panel), an EL (Electro Luminescence) display, or a SED (Surface-conduction Electron-emitter Display). The touch panel 201 is, for example a touch panel of a resistance film method or an electrostatic capacitance method. As a touch panel of the resistance film method, for example, there is a touch panel of a matrix resistance film method. As a touch panel of the electrostatic capacitance method, for example, there is a projection type electrostatic capacitance method of a wire sensor method or an ITO grid method.

First Configuration Example

Figure 16A:
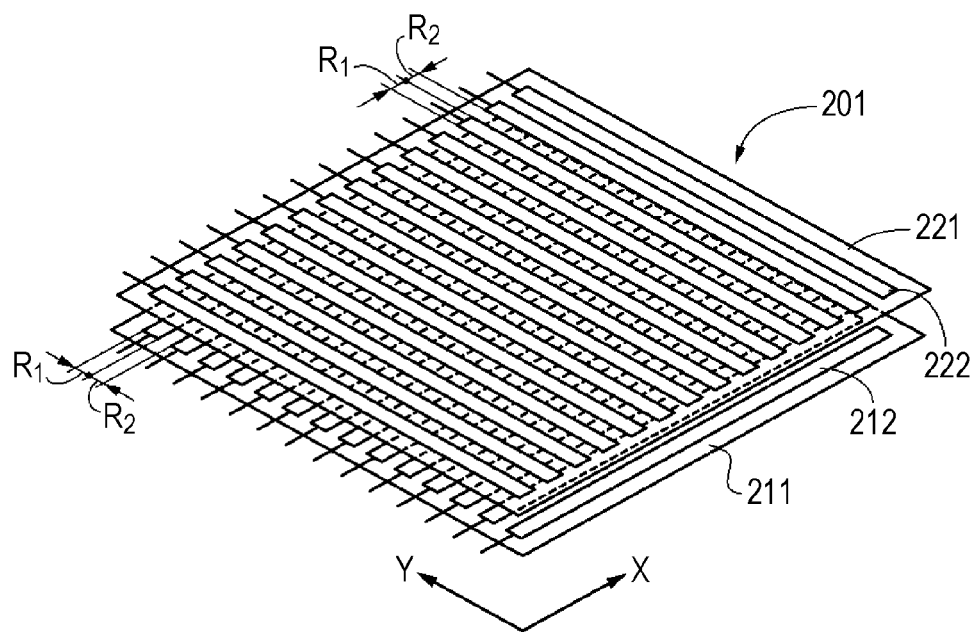
FIG. 16A is a perspective diagram illustrating a first configuration example of a touch panel according to the sixth embodiment of the present disclosure.

FIG. 16A is a perspective diagram illustrating a first configuration example of a touch panel according to the sixth embodiment of the present disclosure. The touch panel 201 is a touch panel of a matrix resistance film method and is provided with a first substrate base 211 and a second substrate base 221 which are disposed so as to oppose and be separated by a predetermined gap via a dot spacer (omitted from the diagram).

Figure 16B:
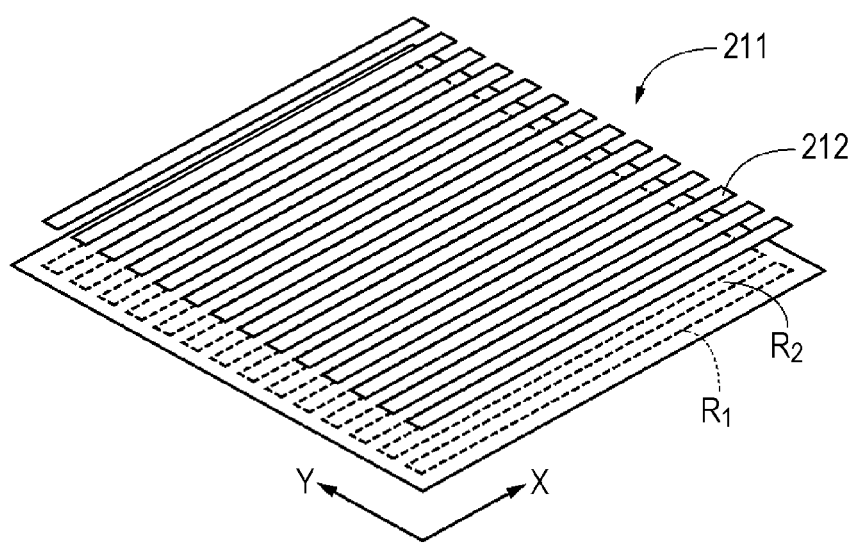
FIG. 16B is an exploded perspective diagram illustrating one configuration example of a first substrate base.

FIG. 16B is an exploded perspective diagram illustrating one configuration example of the first substrate base. Here, since the second substrate base 221 has substantially the same configuration as the first substrate 211, the description of the exploded perspective diagram is omitted. Out of both main surfaces of the first substrate base 211, the first region $R_1$ and the second region $R_2$ with linear shapes are repetitively set to alternate on one main surface which opposes the second substrate base 221. The surface configuration of the first substrate base 211 in regard to the first region $R_1$ and the second region $R_2$ is the same as the surface configuration of the substrate in the conduction element of any of the first to the fourth embodiments described above. For example, the first substrate base surface in the first region $R_1$ is a wave surface where a plurality of structural bodies are formed at an arrangement pitch which is the wavelength of visible light or less and the remaining film is formed in a non-continuous manner such as an island state. On the other hand, in the second region $R_2$, the structural bodies are not formed, the second region $R_2$ is a flat surface, and the laminate film is formed in a continuous manner. Accordingly, out of both main surfaces of the first substrate base 211, a plurality of horizontal (X) electrodes (first electrodes) 212 formed from a laminate film which is formed in a continuous manner are formed in strip shapes in the one main surface which opposes the second substrate base 221.

Out of both main surfaces of the second substrate base 221, the first region $R_1$ and the second region $R_2$ with linear shapes are repetitively set to alternate on one main surface which opposes the first substrate base 211. The surface configuration of the second substrate base 221 in regard to the first region $R_1$ and the second region $R_2$ is the same as the surface configuration of the substrate in the conduction element of any of the first to the fourth embodiments described above. For example, the second substrate base surface in the first region $R_1$ is a wave surface where a plurality of structural bodies are formed at an arrangement pitch which is the wavelength of visible light or less and the remaining film is formed in a non-continuous manner such as an island state. On the other hand, in the second region $R_2$, the structural bodies are not formed, the second region $R_2$ is a flat surface, and the laminate film is formed in a continuous manner. Accordingly, out of both main surfaces of the second substrate base 221, a plurality of vertical (Y) electrodes (second electrodes) 222 formed from a laminate film which is formed in a continuous manner are formed in strip shapes in the one main surface which opposes the first substrate base 211.

The first region $R_1$ and the second region $R_2$ on the first substrate base 211 and the second substrate base 221 are in a relationship which intersects each other. That is, the horizontal electrode 212 on the first substrate base 211 and the vertical electrode 222 on the second substrate base 221 are in a relationship which intersects each other.

Second Configuration Example

Figure 17A:
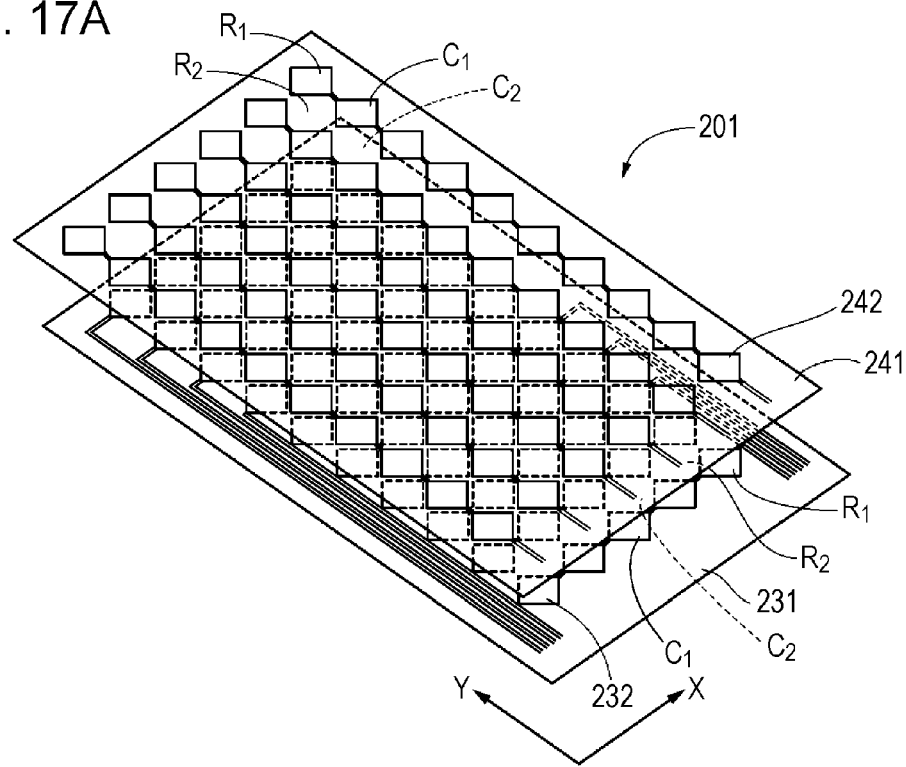
FIG. 17A is a perspective diagram illustrating a second configuration example of a touch panel according to the sixth embodiment of the present disclosure.

FIG. 17A is a perspective diagram illustrating a second configuration example of the touch panel according to the sixth embodiment of the present disclosure. The touch panel is a touch panel of a projection type electrostatic capacitance method with an ITO grid method and is provided with a first substrate base 231 and a second substrate base 241 which overlap.

Figure 17B:
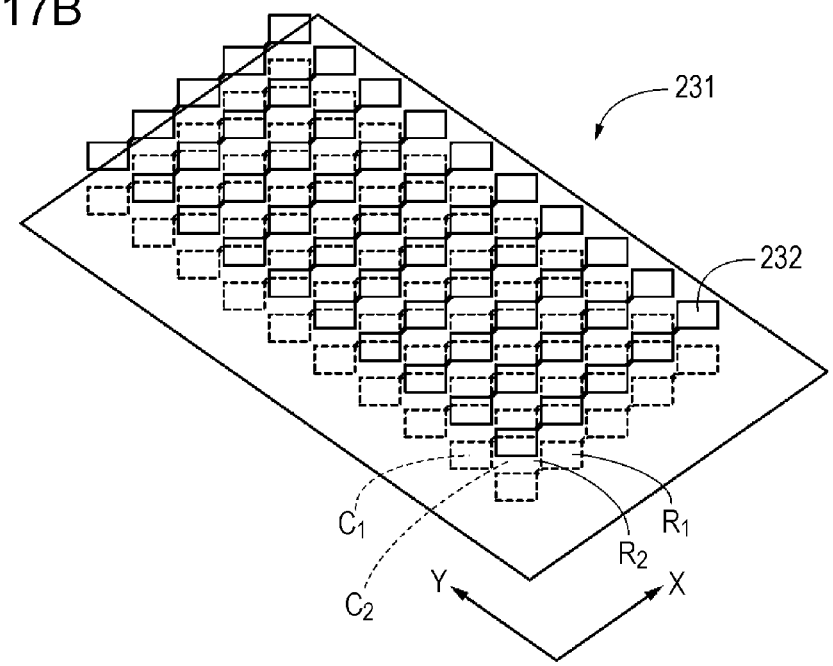
FIG. 17B is an exploded perspective diagram illustrating one configuration example of a first substrate base.

FIG. 17B is an exploded perspective diagram illustrating one configuration example of the first substrate base. Here, since the second substrate base 241 has substantially the same configuration as the first substrate 231, the description of the exploded perspective diagram is omitted. Out of both main surfaces of the first substrate base 231, the first region $R_1$ and the second region $R_2$ with linear shapes are repetitively set to alternate on one main surface which opposes the second substrate base 241 and between the adjacent first regions $R_1$ is separated by the second region $R_2$. Out of both main surfaces of the second substrate base 241, the first region $R_1$ and the second region $R_2$ with linear shapes are repetitively set to alternate on one main surface which opposes the first substrate base 231 and between the adjacent first regions $R_1$ is separated by the second region $R_2$. The surface configuration of the first substrate base 231 and the second substrate base 241 in regard to the first region $R_1$ and the second region $R_2$ is the same as the surface configuration of the substrate in the conduction element of any of the first to the fourth embodiments described above.

In the first region $R_1$ of the first substrate base 231, a unit region $C_1$ with a predetermined shape is repeatedly connected in the X axial direction, and in the second region $R_2$, a unit region $C_2$ with a predetermined shape is repeatedly connected in the X axial direction. In the first region $R_1$ of the second substrate base 241, a unit region $C_1$ with a predetermined shape is repeatedly connected in the Y axial direction, and in the second region $R_2$, a unit region $C_2$ with a predetermined shape is repeatedly connected in the Y axial direction. As the shapes of the unit region $C_1$ and the unit region $C_2$, for example, there is a diamond shape, a triangular shape, a quadrangular shape, or the like, but is not limited to these shapes.

The first substrate base surface or the second substrate base surface in the first region $R_1$ are, for example, wave surfaces where a plurality of structural bodies is formed at an arrangement pitch which is the wavelength of visible light or less, and for example, the remaining film is formed in a non-continuous manner such as an island state. On the other hand, the first substrate base surface or the second substrate base surface in the second region $R_2$, the structural bodies are not formed, the second region $R_2$ is a flat surface, and the laminate film is formed in a continuous manner. Accordingly, out of both main surfaces of the first substrate base 231, a plurality of horizontal (X) electrodes (first electrodes) 232 formed from a laminate film which is formed in a continuous manner are formed in the one main surface which opposes the second substrate base 241. In addition, out of both main surfaces of the second substrate base 241, a plurality of vertical (Y) electrodes (second electrodes) 242 formed from a laminate film which is formed in a continuous manner are formed in the one main surface which opposes the first substrate base 231. The horizontal electrode 232 and the vertical electrode 242 have the same shape as the second region $R_2$.

The horizontal electrode 232 on the first substrate base 231 and the vertical electrode 242 on the second substrate base 241 are in a relationship which intersects each other. In a state where the first substrate base 231 and the second substrate base 241 overlap, the first region $R_1$ on the first substrate base 231 and the second region $R_2$ on the second substrate base 241 overlap and the second region $R_2$ on the first substrate base 231 and the first region $R_1$ on the second substrate base 241 overlap.

In the sixth embodiment, for example, it is possible for an electrode of the touch panel 201 to be manufactured using the presence or absence of the wave surface or the presence or absence of the structural bodies. In addition, in a case where, for example, the wavelength of the wave surface or the arrangement pitch of the structural bodies are the wave length of visible light or less, it is possible for the reflection preventing properties and/or the transparency properties of the touch panel 201 to be improved.

In addition, as in the second embodiment described above, structural bodies where the aspect ratio or the like is different may be formed in each of the first region $R_1$ and the second region $R_2$. Due to this, it is possible to further improve the reflection preventing properties and/or the transparency properties of the touch panel 201. In a configuration such as this, it is preferable that the laminate film in the first region $R_1$ which functions as an electrode be a shape which follows the shape of the structural bodies which are formed in the first region $R_1$. This is because, due to this, it is possible to suppress a reduction in the effect of reflection preventing and/or transparency properties using the structural bodies.

7. Seventh Embodiment

Figure 18A:
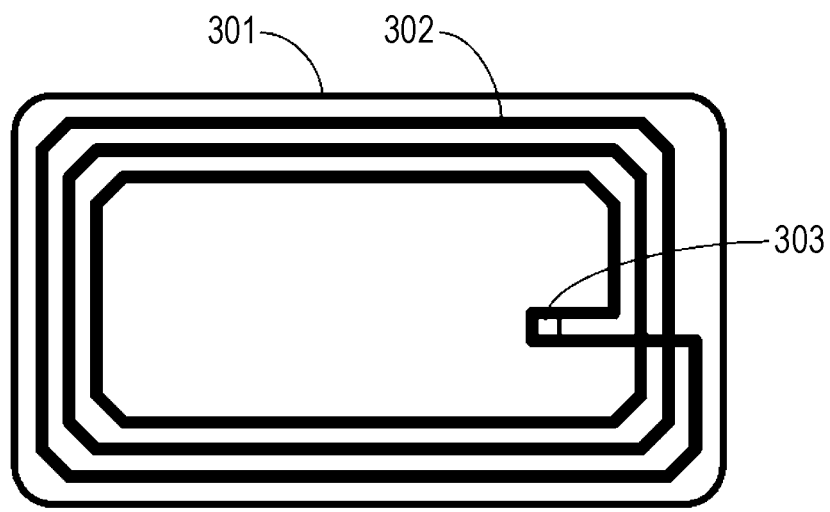
FIG. 18A is a planar diagram illustrating one configuration example of an IC card according to the seventh embodiment of the present disclosure.
Figure 18B:
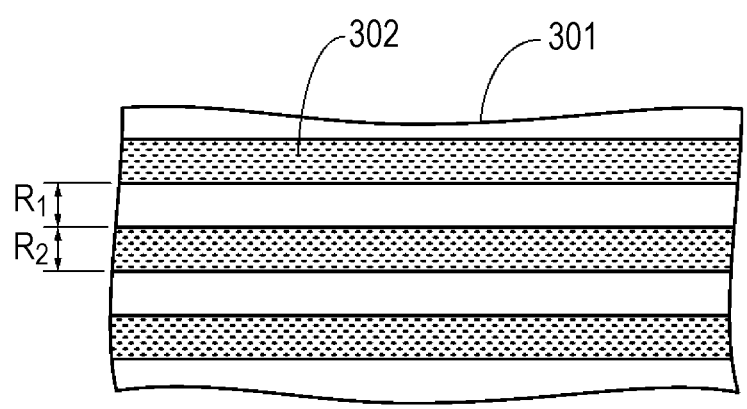
FIG. 18B is a planar diagram representing an enlargement of a portion of the IC card illustrated in FIG. 18A.

FIG. 18A is a planar diagram illustrating one configuration example of an IC card according to the seventh embodiment of the present disclosure. FIG. 18B is a planar diagram representing an enlargement of a portion of the IC card illustrated in FIG. 18A. The IC card is a so-called non-touch type IC card and is provided with a substrate base 301, an antenna coil 302, and an IC chip 303. Both edges of the antenna coil 302 are connected with regard to the IC chip 303. In addition, an outer coating (not shown in the diagram) is provided on both surfaces of the substrate base 301.

As the shape of the substrate base 301, it is possible to use a film shape, a sheet shape, or a substrate shape, but is not particularly limited to these shapes, and it is possible to be arbitrarily selected and used according to the characteristics which are necessary for the IC card 1. As the material for the substrate base 301, it is preferable to use a resin material which has flexibility from the point of view of durability, convenience, and the like. As such a resin material, for example, it is possible to use PEN (polyethylene naphthalate), PET (polyethylene terephthalate), polyimide (PI), or polyester, but is not particularly limited to this, and it is possible to be arbitrarily selected and used from common resin materials in the related art according to the characteristics which are necessary for the IC card.

For example, the first region $R_1$ and the second region $R_2$ are alternately formed in a spiral shape in the periphery section on one main surface of the substrate base 301. The surface configuration of the substrate base 301 in regard to the first region $R_1$ and the second region $R_2$ is the same as the surface configuration of the substrate in the conduction element of any of the first to the fourth embodiments described above. For example, the substrate base surface in the first region $R_1$ is a wave surface where a plurality of structural bodies are formed with an extremely small pitch and the remaining film is formed in a non-continuous manner such as an island state. On the other hand, the substrate base surface in the second region $R_2$, the structural bodies are not formed, the second region $R_2$ is a flat surface, and the laminate film is formed in a continuous manner. Accordingly, the antenna coil 302 formed from the laminate film which is formed continuously is formed to follow the shape of the second region $R_2$ in the periphery section on the one main surface of the substrate base 301. Here, as in the second embodiment described above, structural bodies where the aspect ratio or the like is different may be formed in each of the first region $R_1$ and the second region $R_2$.

The outer coating is configured on the front surface and the rear surface of the IC card, and for example, has a polymer material such as PET (polyethylene terephthalate), PBT (polybutyl terephthalate), PEG (polyethylene glycol), orientated PET as a main component, but is not particularly limited to this, and it is possible to be arbitrarily selected and used from common resin materials in the related art according to the characteristics which are necessary for the IC card.

The antenna coil 302 is an electromagnetic induction coil with a loop coil shape which is formed by being wound a plurality of times on the substrate base 301 and both edges thereof are connected to the IC chip 303. The antenna coil 302 induces an AC voltage by receiving an alternating magnetic field which is generated by a reader/writer and supplies the AC voltage to the IC chip 303.

The IC chip 303 is driven using a power source which is supplied from the antenna coil 302 and controls each section in the IC card 1. For example, the IC chip 303 performs communication with the reader/writer via the antenna coil 302. Specifically, the IC chip 303 performs the exchange of mutual authentication and data with the reader/writer.

In the seventh embodiment, for example, it is possible for the antenna coil 302 of the IC card to be manufactured using the presence or absence of the wave surface or the presence or absence of the structural bodies. Accordingly, it is possible to improve the productivity of the IC card since it is possible for the antenna coil 302 of the IC card to be manufactured without etching or the like.

8. Eighth Embodiment

Figure 19A:
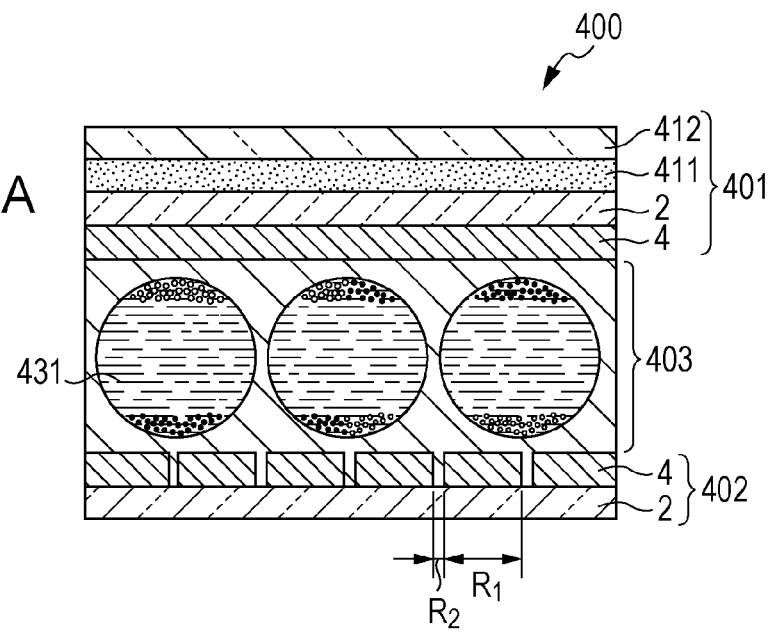
FIG. 19A is a cross-sectional diagram illustrating one example of a configuration of a display device according to an eighth embodiment of the present disclosure.
Figure 19B:
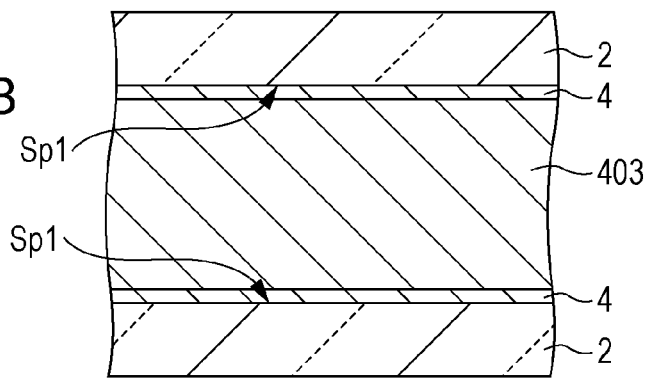
FIG. 19B is an enlarged cross-sectional diagram representing an enlargement of a wiring region illustrated in FIG. 19A.
Figure 19C:
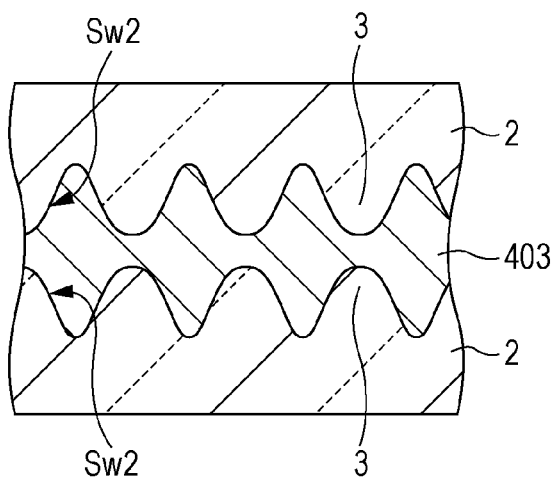
FIG. 19C is an enlarged cross-sectional diagram representing an enlargement of a non-wiring region illustrated in FIG. 19A.

FIG. 19A is a cross-sectional diagram illustrating one example of a configuration of a display device according to an eighth embodiment of the present disclosure. FIG. 19B is an enlarged cross-sectional diagram representing an enlargement of a wiring region illustrated in FIG. 19A. FIG. 19C is an enlarged cross-sectional diagram representing an enlargement of a non-wiring region illustrated in FIG. 19A. In the eighth embodiment, the same locations as or opposing locations to the first embodiment are given the same reference numerals. A display device 400 is so-called electronic paper of a microcapsule electrophoresis method, and is provided with a first conduction element 401, a second conduction element 402 which is disposed to oppose the first conduction element 401, and a microcapsule layer (medium layer) 403 which is provided between both of the elements. Here, an example is described where the present disclosure is applied with regard to electronic paper of a microcapsule electrophoresis method, but the electronic paper is not limited to this example and it is possible for the present disclosure to be applied if there is a configuration where a medium layer is provided between conduction elements which are disposed to oppose. Here, other than a liquid or a solid, a gas such as air may be included in the medium. In addition, in the medium, members such as capsules, pigments, or particles may be included. As the electronic paper other than the microcapsule electrophoresis method where the present disclosure is able to be applied, there is, for example, electronic paper such as a twist ball method, a thermal rewritable method, a toner display method, an in-plane type electrophoresis method, or an electron particle type electrophoresis method.

The microcapsule layer 403 includes a plurality of microcapsules 431. In the microcapsules, for example, a transparent liquid (dispersion solution) where black particles and white particles are dispersed is inserted.

The first conduction element 401 is provided with the substrate 2 which has the flat surface Sp1 and the wave surface Sw2 on a side which opposes the second conduction element 402 and the laminate film 4 which is formed on the wave surface Sw2 on the substrate 2. In addition, the substrate 2 may be bonded to a support body 412 such as glass via an adhesion layer 411 such as an adhesive agent as necessary. The second conduction element 402 is provided with the substrate 2 which has the flat surface Sp1 and the wave surface Sw2 on a side which opposes the first conduction element 401 and the laminate film 4 which is formed on the wave surface Sw2 on the substrate 2.

The laminate film 4 of the first conduction element 401 and the second conduction element 402 is formed in a predetermined electrode pattern shape according to the driving method of the electronic paper 400. As the driving method, for example, there is a simple matrix driving method, an active matrix driving method, a segment driving method, or the like.

Other than this, the eighth embodiment is the same as the first embodiment.

EXAMPLES

Below, the present disclosure will be specifically described using examples, but the present disclosure is not limited only to the examples.

In the example, comparative examples and reference examples below, the surface resistance of the conduction sheets is measured using a four end resistance measuring device. Here, the diameter of a probe tip edge needle is R100 µm and the pitch of the needle is 1 mm.

Reference Example 1

Transfer Process

Figure 20A:
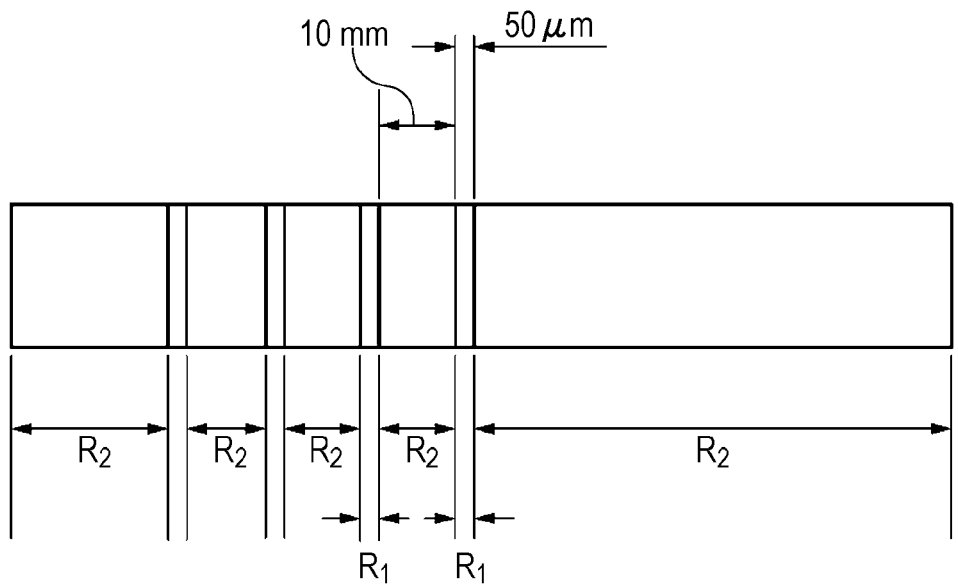
FIG. 20A is a model diagram illustrating a forming surface of a quartz master used in the manufacturing of a transparent conduction sheet according to a reference example.

First, as shown in FIG. 20A, a quartz master was prepared where a flat surface region (first region) $R_1$ and a nano structural body formation region (second region) $R_2$ are formed in a strip shape on a formation surface. Next, an ultraviolet curable resin was coated on the formation surface of the quartz master, a PET sheet with an easy adhesion layer was adhered, and the PET sheet was removed while ultraviolet light was irradiated and curing was performed. Due to this, on the surface of the PET sheet, a plurality of nano structural bodies with a convex shape were formed on the nano structural body formation region (second region) $R_2$, while an optical sheet where a planar surface is formed was obtained in the flat surface region (first region) $R_1$. The arrangement pitch of the structural bodies was 250 nm, the height of the structural bodies was 200 nm, the shape of the structural bodies was a circular truncated cone, and the arrangement of the structural bodies was a six directional arrangement.

(Deposition Process)

Next, an ITO layer was formed on the formation surface of the optical sheet using a sputtering method. The degree of ultimate vacuum was 0.00015 Pa, the degree of vacuum during deposition was 0.24 Pa, Ar gas and $O_2$ gas are introduced during formation, and the mixture ratio thereof was $Ar:O_2=200:13$. In addition, a formation condition where the film thickness when converted to a flat surface is 30 nm was adjusted. Here, the flat plate conversion film thickness is substantially equal to the film thickness of a peak section of a wave surface.

(Annealing Process)

Next, annealing was carried out in air for 30 minutes at 150° C. with regard to the optical sheet where the ITO layer is formed. Due to this, multi-crystallization of the ITO layer was promoted. Next, to confirm the state of promotion, the $In_2O_3$ peak was confirmed by measuring the ITO layer with X-ray diffraction (XRD).

(Etching Process)

Next, the optical sheet where the annealing process has been carried out was immersed in a solution with a PH of approximately three for 20 seconds.

(Washing Process)

Next, the optical sheet where the etching process has been carried out was washed using purified water.

Due to the above, the transparent conduction sheet which is the aim was obtained.

(Evaluation of Conduction/Non-Conduction)

Figure 20B:
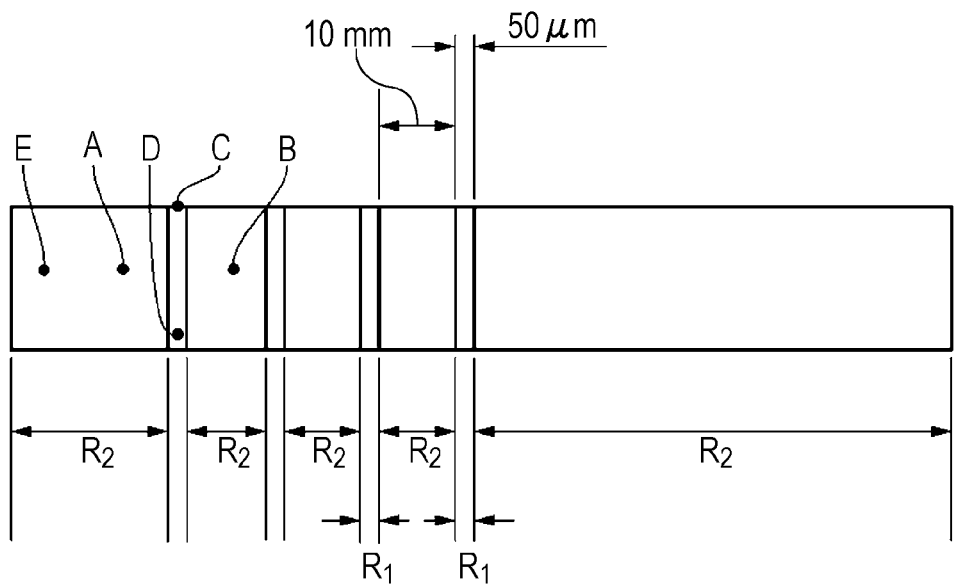
FIG. 20B is a model diagram illustrating a conduction or non-conduction evaluation point of a transparent conduction sheet according to a reference example.

The conduction or non-conduction with regard to the surface of the transparent conduction sheet according to the reference example 1 which was obtained as described above was evaluated using a point which is shown in FIG. 20B using a tester. The evaluation results are shown in Table 1.

Table 1 shows the evaluation results of the transparent conduction sheet according to the reference example 1.

TABLE 1

| | BETWEEN A AND B | BETWEEN E AND A | BETWEEN C AND D |
|---|---|---|---|
| REFERENCE EXAMPLE 1 | INSULATION | INSULATION | 2000 Ω (CONDUCTION) |

The following is understood from Table 1.

Out of the transparent conduction sheet surface, the nano structural body formation region (second region) $R_2$ was in an insulation state and the flat surface region (first region) $R_1$ is in a conduction state. Accordingly, by only sequentially performing the imprint process, the deposition process, and the etching process, it was possible to form the necessary conduction pattern section such as wiring or an electrode on the substrate surface. That is, it is possible to improve throughput.

Example 1-1

Transfer Process

First, a quartz master was manufactured where a first region which has a flat surface (first wave surface) and a second region which has a wave surface (second wave surface) are alternately formed in a strip shape on the same surface.

Next, an ultraviolet curable resin was coated on the formation surface of the quartz master, a PET sheet with an easy adhesion layer was adhered, and the PET sheet was removed while ultraviolet light was irradiated and curing was performed. Due to this, an optical sheet (nano imprint film) where the first region and the second region are transferred was manufactured.

(Shape Measurement)

Next, the average wavelength $\lambda m$ and the average width $Am$ of vibration on the transfer surface of the optical sheet which was manufactured were measured and the ratio $(Am/\lambda m)$ was determined from the measurement values. The results are shown in Table 2.

(Deposition Process)

Next, an ITO layer was formed on the formation surface of the optical sheet using a sputtering method.

Below, the formation conditions during the forming of the ITO layer are shown.

Degree of ultimate vacuum: 0.00015 Pa
Degree of vacuum during deposition: 0.24 Pa
Type of gas: Mixture of Ar gas and $O_2$ gas
Mixture ratio of gas mixture (volume ratio)
Ar:$O_2$=200:13
Flat plate conversion film thickness: 36 nm Here, the flat plate conversion film thickness is a film thickness when the ITO layer is formed on a flat plate as the formation condition in the same manner as the case where the ITO layer is formed on the optical sheet surface and is substantially equal to the film thickness of a peak section of a wave surface.

Next, while the vacuum state is maintained, an Ag layer is formed on the ITO layer using a sputtering method.

Below, the formation conditions during the forming of the Ag layer are shown.

Degree of vacuum during deposition: 0.11 Pa
Type of gas: Ar gas
Amount of gas flow: 100 sccm
Flat plate conversion film thickness: 200 nm (Surface Resistance Measurement)

Next, the surface resistance of the optical sheet which was manufactured as described above was measured. The results are shown in Table 2.

(Removal Process)

Next, the optical sheet was immersed in a solution with a PH of approximately three for 20 seconds.

(Washing Process)

Next, the optical sheet was washed using purified water.

Due to the above, the conduction sheet which is the aim was obtained.

(Surface Resistance Measurement)

Next, the surface resistance of the conduction sheet which was manufactured as described above was measured. The results are shown in Table 2.

Example 1-2

Transfer Process

First, a quartz master was manufactured where a first region which has a wave surface (first wave surface) and a second region which has a flat surface (second wave surface) are alternately formed in a strip shape on the same surface.

Next, an ultraviolet curable resin was coated on the formation surface of the quartz master, a PET sheet with an easy adhesion layer was adhered, and the PET sheet was removed while ultraviolet light was irradiated and curing was performed. Due to this, an optical sheet (nano imprint film) where the first region and the second region are transferred was manufactured.

(Shape Measurement)

Next, the average wavelength and the average width $Am$ of vibration on the transfer surface of the optical sheet which was manufactured were measured and the ratio $(Am/\lambda m)$ was determined from the measurement values. The results are shown in Table 3.

(Deposition Process)

Next, an ITO layer was formed on the formation surface of the optical sheet using a sputtering method.

Below, the formation conditions during the forming of the ITO layer are shown.

Degree of ultimate vacuum: 0.00015 Pa
Degree of vacuum during deposition: 0.24 Pa
Type of gas: Mixture of Ar gas and $O_2$ gas
Mixture ratio of gas mixture (volume ratio)
Ar:$O_2$=200:13
Flat plate conversion film thickness: 40 nm Here, the flat plate conversion film thickness is a film thickness when the ITO layer is formed on a flat plate as the formation condition in the same manner as the case where the ITO layer is formed on the optical sheet surface and is substantially equal to the film thickness of a peak section of a wave surface.

Next, while the vacuum state is maintained, an Ag layer is formed on the ITO layer using a sputtering method.

Below, the formation conditions during the forming of the Ag layer are shown.

Degree of vacuum during deposition: 0.11 Pa
Type of gas: Ar gas
Amount of gas flow: 100 sccm
Flat plate conversion film thickness: 200 nm (Surface Resistance Measurement)

Next, the surface resistance of the optical sheet which was manufactured as described above was measured. The results are shown in Table 3.

(Removal Process)

Next, the optical sheet was immersed in a solution with a PH of approximately three for 60 seconds.

(Washing Process)

Next, the optical sheet was washed using purified water.

Due to the above, the conduction sheet which is the aim was obtained.

(Surface Resistance Measurement)

Next, the surface resistance of the conduction sheet which was manufactured as described above was measured. The results are shown in Table 3.

(Surface Observations)

Figure 21:
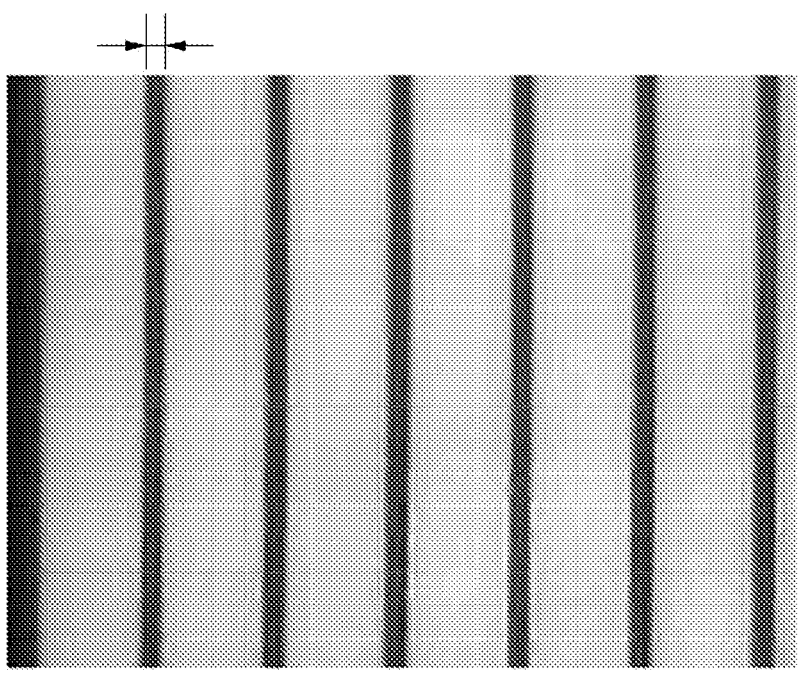
FIG. 21 is a diagram illustrating an image of an observation by optical microscope of a conduction sheet according to an example.

Next, the surface of the conduction sheet which was manufactured as described above was observed using an optical microscope. The results are shown in FIG. 21.

Table 2 shows the measurement results of the conduction sheet according to the example 1-1.

TABLE 2

|  |  | FLAT SURFACE (FIRST REGION) | WAVE SURFACE (SECOND REGION) |
|---|---|---|---|
| AVERAGE WAVELENGTH $\lambda m$ (nm) |  | — | 250 |
| AVERAGE WIDTH OF VARIATION Am (nm) |  | — | 190 |
| RATIO (Am/$\lambda m$) |  | — | 0.76 |
| LAYER CONFIGURATION BEFORE REMOVAL |  | ITO LAYER AND Ag LAYER | |
| SURFACE RESISTANCE ($\Omega$/OPENING) | BEFORE REMOVAL | 0.5 | 1.5 |
|  | AFTER REMOVAL | 0.5 | ∞ |

Table 3 shows the measurement results of the conduction sheet according to the example 1-2.

TABLE 3

|  |  | FLAT SURFACE (FIRST REGION) | WAVE SURFACE (SECOND REGION) |
|---|---|---|---|
| AVERAGE WAVELENGTH $\lambda m$ (nm) |  | — | 300 |
| AVERAGE WIDTH OF VARIATION Am (nm) |  | — | 300 |
| RATIO (Am/$\lambda m$) |  | — | 1 |
| LAYER CONFIGURATION BEFORE REMOVAL |  | ITO LAYER AND Ag LAYER | |
| SURFACE RESISTANCE ($\Omega$/OPENING) | BEFORE REMOVAL | 0.5 | 1.5 |
|  | AFTER REMOVAL | 0.5 | ∞ |

The following is understood from Tables 2 and 3.

Out of the conduction sheet surface, the ITO layer and Ag layer are removed in the removal process from the second region which has the wave surface and the second region is in an insulation state, while the ITO layer and Ag layer are not removed in the removal process and remain in the first region which has the flat surface and the first region remains in a conduction state.

Accordingly, even in a case where the film configuration is a multi-layer configuration in order to lower the electrical resistance, removal selectivity is able to be secured and it is possible for the ITO layer and the Ag layer to remain in the flat surface region. That is, it is possible to easily manufacture low resistance wiring.

Example 1-3

First, a quartz master was manufactured where a first region which has a first wave surface and a second region which has a second wave surface are alternately formed in a strip shape on the same surface.

Next, an ultraviolet curable resin was coated on the formation surface of the quartz master, a PET sheet with an easy adhesion layer was adhered, and the PET sheet was removed while ultraviolet light was irradiated and curing was performed. Due to this, an optical sheet (nano imprint film) where the first region and the second region are transferred was manufactured.

(Shape Measurement)

Next, the average wavelength and the average width Am of vibration on the transfer surface of the optical sheet which was manufactured were measured and the ratio (Am/$\lambda m$) was determined from the measurement values. The results are shown in Table 4.

(Deposition Process)

Next, an ITO layer was formed on the formation surface of the optical sheet using a sputtering method.

Below, the formation conditions during the forming of the ITO layer are shown.

Degree of ultimate vacuum: 0.00015 Pa

Degree of vacuum during deposition: 0.24 Pa

Type of gas: Mixture of Ar gas and $O_2$ gas

Mixture ratio of gas mixture (volume ratio)

Ar:$O_2$=200:13

Flat plate conversion film thickness: 36 nm

Here, the flat plate conversion film thickness is a film thickness when the ITO layer is formed on a flat plate as the formation condition in the same manner as the case where the ITO layer is formed on the optical sheet surface and is substantially equal to the film thickness of a peak section of a structural body.

Next, while the vacuum state is maintained, an Ag layer is formed on the ITO layer using a sputtering method.

Below, the formation conditions during the forming of the Ag layer are shown.

Degree of vacuum during deposition: 0.11 Pa

Type of gas: Ar gas

Amount of gas flow: 100 sccm

Flat plate conversion film thickness: 200 nm (Surface Resistance Measurement)

Next, the surface resistance of the optical sheet which was manufactured as described above was measured. The results are shown in Table 4.

(Removal Process)

Next, the optical sheet was immersed in a solution with a PH of approximately three for 20 seconds.

(Washing Process)

Next, the optical sheet was washed using purified water.

Due to the above, the conduction sheet which is the aim was obtained.

(Surface Resistance Measurement)

Next, the surface resistance of the conduction sheet which was manufactured as described above was measured. The results are shown in Table 4.

Table 4 shows the measurement results of the conduction sheet according to the example 1-3.

TABLE 4

|  | FIRST WAVE SURFACE (FIRST REGION) | SECOND WAVE SURFACE (SECOND REGION) |
|---|---|---|
| AVERAGE WAVELENGTH $\lambda m$ (nm) | 270 | 250 |
| AVERAGE WIDTH OF VARIATION Am (nm) | 160 | 190 |
| RATIO (Am/$\lambda$m) | 0.6 | 0.76 |
| LAYER CONFIGURATION BEFORE REMOVAL | ITO LAYER AND Ag LAYER | |
| SURFACE RESISTANCE ($\Omega$/OPENING) BEFORE REMOVAL | 1.3 | 1.5 |
| SURFACE RESISTANCE ($\Omega$/OPENING) AFTER REMOVAL | 1.3 | ∞ |

The following is understood from Table 4.

Out of the conduction sheet surface, the ITO layer and Ag layer are removed in the removal process from the second region which has a high ratio (Am/$\lambda$m=0.76) and the second region is in an insulation state. On the other hand, the ITO layer and Ag layer are not removed in the removal process and remain in the first region which has a low ratio (Am/$\lambda$m=0.6) and the first region remains in a conduction state.

Accordingly, even in a case where the wave surfaces are formed in both regions of the first region and the second region, removal selectivity is able to be secured by adjusting the size of the ratio (Am/m) and it is possible for the ITO layer and the Ag layer to remain in the first region which has a low ratio (Am/$\lambda$m=0.6). That is, it is possible to easily manufacture low resistance wiring.

Example 2-1

Transfer Process

First, a quartz master was manufactured where a first region which has a wave surface (first wave surface) and a second region which has a flat surface (second wave surface) are alternately formed in a strip shape on the same surface.

Next, an ultraviolet curable resin was coated on the formation surface of the quartz master, a PET sheet with an easy adhesion layer was adhered, and the PET sheet was removed while ultraviolet light was irradiated and curing was performed. Due to this, an optical sheet (nano imprint film) where the first region and the second region are transferred was manufactured.

(Shape Measurement)

Next, the average wavelength $\lambda$m and the average width Am of vibration on the transfer surface of the optical sheet which was manufactured were measured and the ratio (Am/$\lambda$m) was determined from the measurement values. The results are shown in Table 5.

(Deposition Process)

Next, an ITO layer was formed on the formation surface of the optical sheet using a sputtering method.

Below, the formation conditions during the forming of the ITO layer are shown.

Degree of ultimate vacuum: 0.00015 Pa
Degree of vacuum during deposition: 0.24 Pa
Type of gas: Mixture of Ar gas and $O_2$ gas
Mixture ratio of gas mixture (volume ratio)
Ar:$O_2$=200:13
Flat plate conversion film thickness: 36 nm Here, the flat plate conversion film thickness is a film thickness when the ITO layer is formed on a flat plate as the formation condition in the same manner as the case where the ITO layer is formed on the optical sheet surface and is substantially equal to the film thickness of a peak section of a structural body.

Next, while the vacuum state is maintained, a $SiO_2$ layer is formed on the ITO layer using a sputtering method.

Below, the formation conditions during the forming of the $SiO_2$ layer are shown.

Degree of vacuum during deposition: 0.28 Pa
Type of gas: Mixture of Ar gas and $O_2$ gas
Amount of Ar gas flow: 100 sccm
Amount of $O_2$ gas flow: 180 sccm
Flat plate conversion film thickness: 5 nm (Surface Resistance Measurement)

Next, the surface resistance of the optical sheet which was manufactured as described above was measured. The results are shown in Table 5.

(Removal Process)

Next, the optical sheet was immersed in a solution with a PH of approximately three for 60 seconds.

(Washing Process)

Next, the optical sheet was washed using purified water.

Due to the above, the conduction sheet which is the aim was obtained.

(Surface Resistance Measurement)

Next, the surface resistance of the conduction sheet which was manufactured as described above was measured. The results are shown in Table 5.

Comparative Example 2-1

An optical sheet was manufactured in the same manner as the example 2-1 other than the formation of the $SiO_2$ layer was omitted. In addition, the surface resistance of the optical sheet before and after the removal process was also measured in the same manner as the example 2-1. The results are shown in Table 6.

Table 5 shows the measurement results of the conduction sheet according to the example 2-1.

TABLE 5

|  | FLAT SURFACE (FIRST REGION) | WAVE SURFACE (SECOND REGION) |
|---|---|---|
| AVERAGE WAVELENGTH $\lambda$m (nm) | — | 250 |
| AVERAGE WIDTH OF VARIATION Am (nm) | — | 160 |
| RATIO (Am/$\lambda$m) | — | 0.64 |
| LAYER CONFIGURATION BEFORE REMOVAL | ITO LAYER AND $SiO_2$ LAYER | |
| SURFACE RESISTANCE ($\Omega$/OPENING) BEFORE REMOVAL | 400 | 1800 |
| SURFACE RESISTANCE ($\Omega$/OPENING) AFTER REMOVAL | 400 | ∞ |

Table 6 shows the measurement results of the optical sheet according to the comparative example 2-1.

TABLE 6

|  | FLAT SURFACE (FIRST REGION) | WAVE SURFACE (SECOND REGION) |
|---|---|---|
| AVERAGE WAVELENGTH $\lambda$m (nm) | — | 250 |
| AVERAGE WIDTH OF VARIATION Am (nm) | — | 160 |

TABLE 6-continued

|  | FLAT SURFACE (FIRST REGION) | WAVE SURFACE (SECOND REGION) |
|---|---|---|
| RATIO (Am/λm) | — | 0.64 |
| LAYER CONFIGURATION BEFORE REMOVAL | ITO LAYER | |
| SURFACE RESISTANCE (Ω/OPENING) BEFORE REMOVAL | 400 | 1800 |
| AFTER REMOVAL | ∞ | ∞ |

The following is understood from Tables 5 and 6.

In the example 2-1, out of the conduction sheet surface, the ITO layer and $SiO_2$ layer are removed in the removal process from the second region which has the wave surface and the second region is in an insulation state, while the ITO layer and the $SiO_2$ layer are not removed in the removal process and remain in the first region which has the flat surface and the first region remains in a conduction state.

In the comparative example 2-1 where only the ITO layer is formed, when the removal process of 60 second has elapsed, the ITO layer is removed and the region is in an insulation state irrespective of being the flat surface or the wave surface.

Accordingly, even in a case where a multi-layer configuration is adopted where the $SiO_2$ layer which is a resist layer is used instead of the Ag layer which is a metal layer, removal selectivity is able to be secured and it is possible for the ITO layer and the $SiO_2$ layer to remain in the flat surface region. In addition, by the $SiO_2$ layer being laminated on the ITO layer, it is possible to improve the durability of the ITO layer in the removal process and to dramatically improve the removal selectivity.

Example 2-2

First, a quartz master was manufactured where a first region which has a first wave surface and a second region which has a second wave surface are formed alternately in a strip shape on the same surface.

Next, an ultraviolet curable resin was coated on the formation surface of the quartz master, a PET sheet with an easy adhesion layer was adhered, and the PET sheet was removed while ultraviolet light was irradiated and curing was performed. Due to this, an optical sheet (nano imprint film) where the first region and the second region are transferred was manufactured.
(Shape Measurement)

Next, the average wavelength λm and the average width Am of vibration on the transfer surface of the optical sheet which was manufactured were measured and the ratio (Am/λm) was determined from the measurement values. The results are shown in Table 7.
(Deposition Process)

Next, an ITO layer was formed on the formation surface of the optical sheet using a sputtering method.

Below, the formation conditions during the forming of the ITO layer are shown.

Degree of ultimate vacuum: 0.00015 Pa
Degree of vacuum during deposition: 0.24 Pa
Type of gas: Mixture of Ar gas and $O_2$ gas
Mixture ratio of gas mixture (volume ratio) $Ar:O_2=200:13$
Flat plate conversion film thickness: 36 nm Here, the flat plate conversion film thickness is a film thickness when the ITO layer is formed on a flat plate as the formation condition in the same manner as the case where the ITO layer is formed on the optical sheet surface and is substantially equal to the film thickness of a peak section of a structural body.

Next, while the vacuum state is maintained, a $SiO_2$ layer is formed on the ITO layer using a sputtering method.

Below, the formation conditions during the forming of the $SiO_2$ layer are shown.

Degree of vacuum during deposition: 0.28 Pa
Type of gas: Mixture of Ar gas and $O_2$ gas
Amount of Ar gas flow: 100 sccm
Amount of $O_2$ gas flow: 180 sccm
Flat plate conversion film thickness: 5 nm
(Surface Resistance Measurement)

Next, the surface resistance of the optical sheet which was manufactured as described above was measured. The results are shown in Table 7.
(Removal Process)

Next, the optical sheet was immersed in a solution with a PH of approximately three for 60 seconds.
(Washing Process)

Next, the optical sheet was washed using purified water.

Due to the above, the conduction sheet which is the aim was obtained.
(Surface Resistance Measurement)

Next, the surface resistance of the conduction sheet which was manufactured as described above was measured. The results are shown in Table 7.

Comparative Example 2-2

An optical sheet was manufactured in the same manner as the example 2-2 other than the formation of the $SiO_2$ layer was omitted. In addition, the surface resistance of the optical sheet before and after the removal process was also measured in the same manner as the example 2-2. The results are shown in Table 8.

Table 7 shows the measurement results of the conduction sheet according to the example 2-2.

TABLE 7

|  | FIRST WAVE SURFACE (FIRST REGION) | SECOND WAVE SURFACE (SECOND REGION) |
|---|---|---|
| AVERAGE WAVELENGTH λm (nm) | 250 | 250 |
| AVERAGE WIDTH OF VARIATION Am (nm) | 130 | 160 |
| RATIO (Am/λm) | 0.52 | 0.64 |
| LAYER CONFIGURATION BEFORE REMOVAL | ITO LAYER AND $SiO_2$ LAYER | |
| SURFACE RESISTANCE (Ω/OPENING) BEFORE REMOVAL | 705 | 1800 |
| AFTER REMOVAL | 800 | ∞ |

Table 8 shows the measurement results of the optical sheet according to the comparative example 2-2.

TABLE 8

|  | FIRST WAVE SURFACE (FIRST REGION) | SECOND WAVE SURFACE (SECOND REGION) |
|---|---|---|
| AVERAGE WAVELENGTH λm (nm) | 250 | 250 |

TABLE 8-continued

| | FIRST WAVE SURFACE (FIRST REGION) | SECOND WAVE SURFACE (SECOND REGION) |
|---|---|---|
| AVERAGE WIDTH OF VARIATION Am (nm) | 130 | 160 |
| RATIO (Am/λm) | 0.52 | 0.64 |
| LAYER CONFIGURATION BEFORE REMOVAL | ITO LAYER | |
| SURFACE RESISTANCE (Ω/OPENING) BEFORE REMOVAL | 700 | 1800 |
| AFTER REMOVAL | ∞ | ∞ |

The following is understood from Tables 7 and 8.

In the example 2-2, out of the conduction sheet surface, the ITO layer and SiO$_2$ layer are removed in the removal process from the second region which has a high ratio (Am/λm=0.64) and the second region is in an insulation state. On the other hand, the ITO layer and the SiO$_2$ layer are not removed in the removal process and remain in the first region which has a low ratio (Am/λm=0.52) and the remaining first region is in a conduction state.

In the comparative example 2-2 where only the ITO layer is formed, when the removal process of 60 second has elapsed, the ITO layer is removed and the region is in an insulation state irrespective of the size of a high ratio (Am/λm).

Accordingly, even in a case where a multi-layer configuration is adopted where the SiO$_2$ layer which is a resist layer is used instead of the Ag layer which is a metal layer, removal selectivity is able to be secured by adjusting the size of the ratio (Am/λm) and it is possible for the ITO layer and the SiO$_2$ layer to remain in the first region which has a low ratio (Am/λm=0.52). In addition, by the SiO$_2$ layer being laminated on the ITO layer, it is possible to improve the durability of the ITO layer in the removal process and to dramatically improve the removal selectivity.

Reference Example 2-1

Deposition Process

First, a PET sheet with a smooth surface was prepared. Next, an ITO layer was formed on the PET sheet using a sputtering method. The degree of ultimate vacuum was 0.00015 Pa, the degree of vacuum during deposition was 0.24 Pa, Ar gas and O$_2$ gas are introduced during formation, and the mixture ratio thereof was Ar:O$_2$=20:1. In addition, a formation condition where the film thickness of the ITO layer is 30 nm was adjusted.

(Annealing Process)

Next, annealing was carried out in air for 60 minutes at 150° C. with regard to the PET sheet where the ITO layer is formed. Due to this, multi-crystallization of the ITO layer was promoted. Next, to confirm the state of promotion, the In$_2$O$_3$ peak was confirmed by measuring the ITO layer with X-ray diffraction (XRD).

Due to the above, the optical sheet which is the aim was obtained.

Reference Example 2-2

Deposition Process and Annealing Process

First, a deposition process and an annealing process was performed in the same manner as the reference example 2-1 and a PET film which has an ITO layer where the annealing process has been performed is manufactured.

(Etching Process)

Next, the PET film where the annealing process has been carried out was immersed in a solution with a PH of approximately three for 10 seconds and etching of the ITO layer was carried out.

(Washing Process)

Next, washing with purified water, washing with IPA (isopropyl alcohol), and washing with purified water was sequentially performed with regard to the PET sheet where the etching process has been carried out.

Due to the above, the optical sheet which is the aim was obtained.

Reference Example 2-3

An optical sheet was obtained in the same manner as the reference example 2-2 other than the immersion time was changed to 20 seconds.

Reference Example 2-4

An optical sheet was obtained in the same manner as the reference example 2-2 other than the immersion time was changed to 30 seconds.

Reference Example 2-5

An optical sheet was obtained in the same manner as the reference example 2-2 other than the immersion time was changed to 40 seconds.

Reference Example 2-6

An optical sheet was obtained in the same manner as the reference example 2-2 other than the immersion time was changed to 50 seconds.

Reference Example 2-7

An optical sheet was obtained in the same manner as the reference example 2-2 other than the immersion time was changed to 60 seconds.

Reference Example 3-1

Transfer Process

First, a quartz master was prepared where nano structural bodies with a concave shape are formed on a formation surface. Next, an ultraviolet curable resin was applied to the quartz master where nano structural bodies are formed, a PET sheet with an easy adhesion layer was adhered, and the PET sheet was peeled off while ultraviolet light was irradiated and curing was performed. Due to this, the PET sheet where a plurality of the nano structural bodies is formed on the surface thereof is obtained.

Below, the details of the configuration of the nano structural bodies which are formed on the PET sheet surface are shown.

Arrangement of structural bodies: six directional grid arrangement

Concave and convex shape of structural bodies: convex shape

Overall shape of structural bodies: circular truncated cone

Arrangement pitch of structural bodies: 250 nm

Height of structural bodies: 90 nm
Aspect ratio of structural bodies: 0.36
(Deposition Process)
Next, an ITO layer was formed on the surface of the PET sheet where the nano structural bodies are formed using a sputtering method. The degree of ultimate vacuum was 0.00015 Pa, the degree of vacuum during deposition was 0.24 Pa, Ar gas and $O_2$ gas are introduced during formation, and the mixture ratio thereof was Ar:$O_2$=20:1. In addition, a formation condition where the film thickness when converted to a flat surface becomes 30 nm was adjusted. Here, the flat plate conversion film thickness is a film thickness when the ITO layer is formed on a flat plate as the formation condition in the same manner as the case where the ITO layer is formed on the PET sheet surface where the nano structural bodies are formed. According to the understanding of the present disclosure, the flat plate conversion film thickness is substantially equal to the film thickness of a peak section of a structural body.
(Annealing Process)
Next, annealing was carried out in air for 60 minutes at 150° C. with regard to the PET sheet where the ITO layer is formed. Due to this, multi-crystallization of the ITO layer was promoted. Next, to confirm the state of promotion, the $In_2O_3$ peak was confirmed by measuring the ITO layer with X-ray diffraction (XRD).

Due to the above, the optical sheet which is the aim was obtained.

Reference Example 3-2

Deposition Process and Annealing Process

First, a deposition process and an annealing process was performed in the same manner as the reference example 3-1 and a PET film which has an ITO layer where the annealing process has been performed is manufactured.
(Etching Process)
Next, the PET film where the annealing process has been carried out was immersed in a solution with a PH of approximately three for 10 seconds and etching of the ITO layer was carried out.
(Washing Process)
Next, washing with purified water, washing with IPA, and washing with purified water was sequentially performed with regard to the PET sheet where the etching process has been carried out.

Due to the above, the optical sheet which is the aim was obtained.

Reference Example 3-3

An optical sheet was obtained in the same manner as the reference example 3-2 other than the immersion time was changed to 20 seconds.

Reference Example 4-1

An optical sheet was obtained in the same manner as the reference example 3-1 other than the arrangement pitch of the structural bodies was 250 nm, the height of the structural bodies was 120 nm, and the aspect ratio was 0.48.

Reference Example 4-2

An optical sheet was obtained in the same manner as the reference example 3-2 other than the arrangement pitch of the structural bodies was 250 nm, the height of the structural bodies was 120 nm, and the aspect ratio was 0.48.

Reference Example 4-3

An optical sheet was obtained in the same manner as the reference example 3-3 other than the arrangement pitch of the structural bodies was 250 nm, the height of the structural bodies was 120 nm, and the aspect ratio was 0.48.

Reference Example 5-1

An optical sheet was obtained in the same manner as the reference example 3-1 other than the arrangement pitch of the structural bodies was 250 nm, the height of the structural bodies was 155 nm, and the aspect ratio was 0.62.

Reference Example 5-2

An optical sheet was obtained in the same manner as the reference example 3-2 other than the arrangement pitch of the structural bodies was 250 nm, the height of the structural bodies was 155 nm, and the aspect ratio was 0.62.

Reference Example 5-3

An optical sheet was obtained in the same manner as the reference example 3-3 other than the arrangement pitch of the structural bodies was 250 nm, the height of the structural bodies was 155 nm, and the aspect ratio was 0.62.

Reference Example 6-1

Deposition Process and Annealing Process

A deposition process and an annealing process was performed in the same manner as the reference example 3-1 other than a prism sheet below was used and a prism sheet which has an ITO layer where the annealing process has been performed is manufactured.

Due to the above, the optical sheet which is the aim was obtained.

Below, the details of the prism sheet are shown.
Arrangement of prisms (structural bodies): one-dimensional arrangement
Concave and convex shape of prisms: convex shape
Shape of prisms: column shape with isosceles triangle shape as cross section
Arrangement pitch of prisms: 10 μm
Height of prisms: 5 μm
Aspect ratio of prisms: 0.50

Reference Example 6-2

Deposition Process and Annealing Process

First, a deposition process and an annealing process was performed in the same manner as the reference example 6-1 and a prism sheet which has an ITO layer where the annealing process has been performed is manufactured.
(Etching Process)
Next, the prism sheet where the annealing process has been carried out was immersed in a solution with a PH of approximately three for 10 seconds and etching of the ITO layer was carried out.

(Washing Process)

Next, washing with purified water, washing with IPA, and washing with purified water was sequentially performed with regard to the prism sheet where the etching process has been carried out.

Due to the above, the optical sheet which is the aim was obtained.

Reference Example 6-3

An optical sheet was obtained in the same manner as the reference example 6-2 other than the immersion time was changed to 20 seconds.

Reference Example 6-4

An optical sheet was obtained in the same manner as the reference example 6-2 other than the immersion time was changed to 30 seconds.

Reference Example 6-5

An optical sheet was obtained in the same manner as the reference example 6-2 other than the immersion time was changed to 40 seconds.

(Surface Resistance)

The surface resistance values of the surfaces of the optical sheets of the reference examples 2-1 to 6-5 which were obtained as described above were measured using a four end needle method. The results are shown in Table 9.

(Inverse of Initial Rate of Change)

The inverse of the initial rate of change (change in virtual thickness) in the surfaces of the optical sheets of the reference examples 2-1 to 6-5 which were obtained as described above were determined using the equation below. The results are shown in Table 10 and in FIG. 22.

(Inverse of Rate of Change of Initial Surface Resistance)=(Surface Resistance of Sample Before Etching)/(Surface Resistance of Sample After Etching)

Table 9 shows the evaluation results of the surface resistance of the optical sheets of the reference examples 2-1 to 6-5.

TABLE 9

|  | PITCH | HEIGHT | Aspect | IMMERSION TIME (sec) | | | | | | |
|---|---|---|---|---|---|---|---|---|---|---|
|  |  |  |  | 0 | 10 | 20 | 30 | 40 | 50 | 60 |
| REFERENCE EXAMPLE 2-1 to 2-7 | 0 | 0 | 0.00 | 208 | 187 | 193 | 194 | 197 | 201 | 201.8 |
| REFERENCE EXAMPLE 3-1 to 3-3 | 250 nm | 90 nm | 0.36 | 228 | 568 | ∞ | — | — | — | — |
| REFERENCE EXAMPLE 4-1 to 4-3 | 250 nm | 120 nm | 0.48 | 258 | 2900 | ∞ | — | — | — | — |
| REFERENCE EXAMPLE 5-1 to 5-3 | 250 nm | 155 nm | 0.62 | 309 | 9000 | ∞ | — | — | — | — |
| REFERENCE EXAMPLE 6-1 to 6-5 | 10 μm | 5 μm | 0.50 | 282 | 634 | 740 | 3000 | ∞ | — | — |

UNIT: Ω/OPENING

Table 10 shows the evaluation results of the inverse the initial rate of change of the optical sheets of the reference examples 2-1 to 6-5.

TABLE 10

|  | PITCH | HEIGHT | Aspect | IMMERSION TIME (sec) | | | | | | |
|---|---|---|---|---|---|---|---|---|---|---|
|  |  |  |  | 0 | 10 | 20 | 30 | 40 | 50 | 60 |
| REFERENCE EXAMPLE 2-1 to 2-7 | 0 | 0 | 0.00 | 1 | 1.11 | 1.08 | 1.07 | 1.06 | 1.03 | 1.03 |
| REFERENCE EXAMPLE 3-1 to 3-3 | 250 nm | 90 nm | 0.36 | 1 | 0.40 | 0 | — | — | — | — |
| REFERENCE EXAMPLE 4-1 to 4-3 | 250 nm | 120 nm | 0.48 | 1 | 0.09 | 0 | — | — | — | — |
| REFERENCE EXAMPLE 5-1 to 5-3 | 250 nm | 155 nm | 0.62 | 1 | 0.03 | 0 | — | — | — | — |
| REFERENCE EXAMPLE 6-1 to 6-5 | 10 μm | 5 μm | 0.50 | 1 | 0.44 | 0.38 | 0.09 | 0 | — | — |

(INITIAL INVERSE OF RATE OF CHANGE) = (SURFACE RESISTANCE OF SAMPLE BEFORE ETCHING)/(SURFACE RESISTANCE OF SAMPLE AFTER ETCHING)

Figure 22:
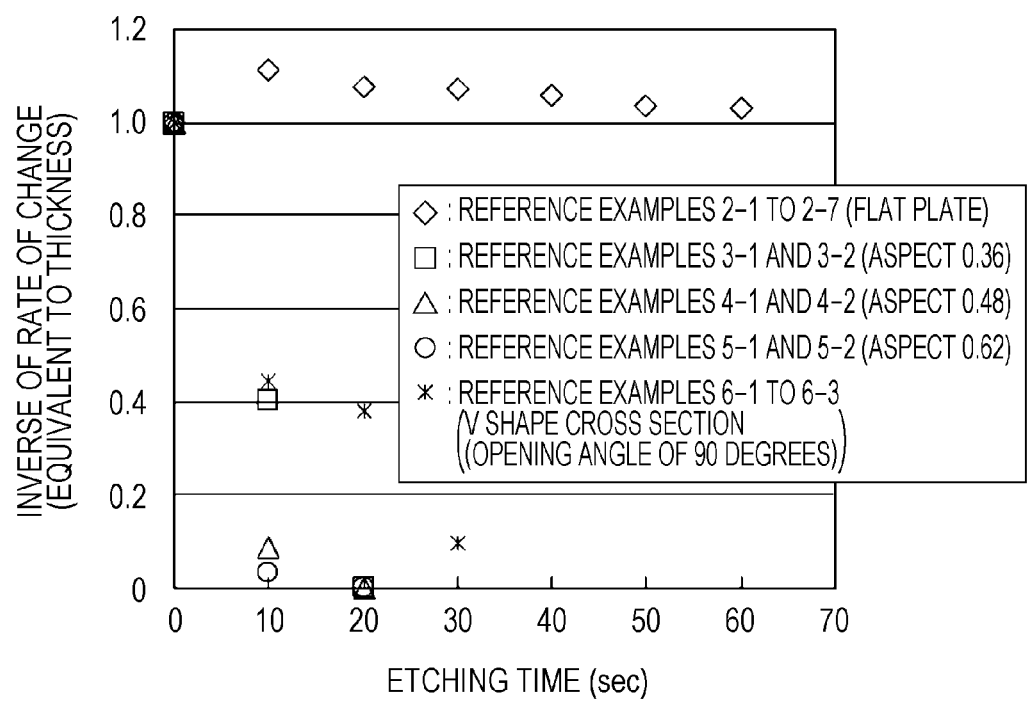
FIG. 22 is a graph illustrating a relationship between etching time and a reciprocal number (virtual thickness variation) with regard to initial surface resistance.

The following is understood from Tables 9 and 10 and FIG. 22.

In the reference examples 2-1 to 2-7 where the ITO layer is formed on the planar surface, there is a tendency for the film thickness of the ITO film to hardly change due to etching and the surface resistance to be substantially constant. On the other hand, in the reference examples 3-1 to 3-3, the reference examples 4-1 to 4-3, and reference examples 5-1 to 5-3 where the ITO layer is formed on the plurality of structural bodies, there is a tendency for the thickness of the ITO layer to be dramatically reduced due to etching and the surface resistance to dramatically increase.

Even in the reference examples 6-1 to 6-5 where the plurality of structural bodies are formed with an arrangement pitch of a micron order, the same tendency is exhibited as the reference examples 3-1 to 3-3, the reference examples 4-1 to 4-3, and reference examples 5-1 to 5-3 where the plurality of structural bodies are formed with an arrangement pitch of a nano order.

Above, the embodiments of the present disclosure have been described in detail, but the present disclosure is not limited to the embodiments described above and various modifications are possible based on the technical concept of the present disclosure.

For example, the configurations, methods, processes, shapes, materials, numerical values, and the like of the embodiments described above are just examples and different configurations, methods, processes, shapes, materials, numerical values, and the like may be used as necessary.

In addition, the configurations, methods, processes, shapes, materials, numerical values, and the like of the embodiments described above are able to be combined with each other as long as this does not depart from the gist of the present disclosure.

In addition, in the embodiments described above, the example where the present disclosure is applied with regard to the conduction element with a single layer where wiring is formed on one surface or both surfaces has been described, but the present disclosure is not limited to this example and is possible to be applied also with regard to a conduction element with multiple layers.

In addition, in the embodiments described above, a case where wiring is formed on the substrate surface with the flat surface has been described as an example, but the surface where the wiring is formed is not limited to the flat surface and the wiring may be formed on a substrate surface with a curved surface shape.

In addition, in the embodiments described above, the example where the present disclosure is applied with regard to the liquid crystal display element has been described, but the present disclosure is not limited to this example and is possible to be applied to also with regard to various display elements with a passive matrix driving method (for example, an EL element, electronic paper, or the like).

In addition, in the embodiments described above, the example where the present disclosure is applied with regard to the touch panel with a projection type electrostatic capacitance method which has a configuration where two substrate bases are overlapped has been described, but the present disclosure is not limited to this example. For example, the present disclosure is also able to be applied with regard to the touch panel with a projection type electrostatic capacitance method with a configuration where electrodes are formed on both sides of one substrate base.

In addition, in the embodiments described above, the example where the present disclosure is applied with regard to the display device and the information input device as electronic apparatuses has been described, but the present disclosure is not limited to this example and is able to be applied with regard to various electronic apparatuses which includes the display element, the wiring element (for example, a print substrate), or the like.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A conduction element comprising:
a substrate including first regions and second regions alternately arranged, the first regions having a first wave surface including a concave and convex surface where a plurality of first structural bodies are formed at an arrangement pitch which is the wavelength of visible light or less, and the second regions having a second wave surface including a concave and convex surface where a plurality of second structural bodies are formed at an arrangement pitch which is the wavelength of visible light or less; and
a laminate film which is formed on the first wave surface in the first region and where two or more layers are laminated in the laminate film,
wherein the laminate film forms a conduction pattern in the first region, and the second region is an insulating region for insulating between portions of the conductive pattern,
wherein the first wave surface and the second wave surface satisfy a relationship below, $$0 < (Am1/\lambda m1) < (Am2/\lambda m2) \leq 1.8$$

wherein Am1 is an average width of vibration in the first wave surface, Am2 is an average width of vibration in the second wave surface, $\lambda m1$ is an average wavelength of the first wave surface, and $\lambda m2$ is an average wavelength of the second wave surface, and
wherein the average wavelength of the second wave surface $\lambda m2$ is the wavelength of visible light or less.

2. The conduction element according to claim 1,
wherein the average wavelength of the first wave surface $\lambda m1$ is the wavelength of visible light or less.

3. The conduction element according to claim 1,
wherein
the average wavelength of the first wave surface $\lambda m1$ and the average wavelength of the second wave surface $\lambda m2$ are 100 nm or more.

4. The conduction element according to claim 1, further comprising:
a remaining film which is formed on the second wave surface and is a portion of the laminate film,
wherein the laminate film and the remaining film satisfy a relationship below $$S1 > S2,$$

where S1 is an area of the laminate film and S2 is an area of the remaining film.

5. The conduction element according to claim 4,
wherein the laminate film which is formed on the first wave surface is formed in a continuous manner on the first wave surface while the remaining film which is formed on the second wave surface is formed in a non-continuous manner on the second wave surface.

6. The conduction element according to claim 1, further comprising:
   a remaining film which is formed on the second wave surface and is a portion of the laminate film,
   wherein the laminate film and the remaining film satisfy a relationship below $$d1 > d2$$

where d1 is a thickness of the laminate film, and d2 is a thickness of the remaining film.
7. The conduction element according to claim 1,
   wherein the laminate film is provided with a conduction layer and a functional layer which is formed on the conduction layer, and
   the functional layer is formed from a different material to the conduction layer.
8. The conduction element according to claim 1,
   wherein the laminate film is formed using materials with different removal speeds from each other.
9. The conduction element according to claim 7,
   wherein the conduction layer is a transparent conduction layer which includes an oxide compound semiconductor.
10. The conduction element according to claim 9,
    wherein the oxide compound semiconductor includes indium tin oxide or zinc oxide.
11. The conduction element according to claim 7,
    wherein the conduction layer is in a mixture of amorphous and polycrystalline states.
12. The conduction element according to claim 7,
    wherein the conduction layer includes at least one type selected from a group consisting of Ag, Al, Au, Pt, Pd, Ni, Cr, Nb, W, Mo, Ti, and Cu.
13. The conduction element according to claim 7,
    wherein the functional layer includes at least one type selected from a group consisting of oxide compounds and transition metal compounds.
14. The conduction element according to claim 7,
    wherein the functional layer includes at least one type selected from a group consisting of Ag, Al, Au, Pt, Pd, Ni, Cr, Nb, W, Mo, Ti, and Cu.
15. The conduction element according to claim 7,
    wherein the functional layer include at least one type of a layer in a mixture of amorphous and polycrystalline states and a layer in a polycrystallized state.
16. A wiring element comprising:
    the conduction element according to claim 1.
17. An information input device comprising:
    the conduction element according to claim 1.
18. A display device comprising:
    the conduction element according to claim 1.
19. An electronic apparatus comprising:
    the conduction element according to claim 1.

* * * * *